United States Patent
Hsieh et al.

(10) Patent No.: US 10,361,122 B1
(45) Date of Patent: Jul. 23, 2019

(54) PROCESSES FOR REDUCING LEAKAGE AND IMPROVING ADHESION

(71) Applicant: Taiwan Semiconductor Manufacturing Company, Ltd., Hsinchu (TW)

(72) Inventors: Yun Chen Hsieh, Baoshan Township (TW); Hui-Jung Tsai, Hsinchu (TW); Hung-Jui Kuo, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/958,177

(22) Filed: Apr. 20, 2018

(51) Int. Cl.
| | |
|---|---|
| *H01L 21/44* | (2006.01) |
| *H01L 21/48* | (2006.01) |
| *H01L 21/50* | (2006.01) |
| *H01L 21/768* | (2006.01) |
| *H01L 21/3213* | (2006.01) |
| *H01L 21/56* | (2006.01) |
| *H01L 23/31* | (2006.01) |
| *H01L 23/532* | (2006.01) |
| *H01L 23/00* | (2006.01) |
| *H01L 23/522* | (2006.01) |

(52) U.S. Cl.
CPC .. *H01L 21/76871* (2013.01); *H01L 21/32139* (2013.01); *H01L 21/565* (2013.01); *H01L 21/76856* (2013.01); *H01L 23/3107* (2013.01); *H01L 23/5226* (2013.01); *H01L 23/53238* (2013.01); *H01L 24/09* (2013.01); *H01L 24/14* (2013.01); *H01L 24/17* (2013.01); *H01L 24/32* (2013.01); *H01L 2224/02379* (2013.01)

(58) Field of Classification Search
CPC ......... H01L 21/76871; H01L 21/32139; H01L 21/565; H01L 23/3107; H01L 23/5226
USPC .......................................................... 438/127
See application file for complete search history.

(56) References Cited

U.S. PATENT DOCUMENTS

| | | |
|---|---|---|
| 6,323,542 B1 | 11/2001 | Hashimoto |
| 9,553,001 B2 | 1/2017 | Chen et al. |
| 9,922,939 B2 | 3/2018 | Chen et al. |
| 2002/0005568 A1 | 1/2002 | Kikuchi |
| 2012/0009777 A1 | 1/2012 | Liu et al. |
| 2015/0279776 A1 | 10/2015 | Hu et al. |
| 2016/0247767 A1 | 8/2016 | Kim et al. |
| 2016/0260682 A1 | 9/2016 | Scanlan et al. |

(Continued)

FOREIGN PATENT DOCUMENTS

| | | |
|---|---|---|
| DE | 102016115788 A1 | 4/2017 |
| TW | 201639046 A | 11/2016 |
| TW | 201724387 A | 7/2017 |

*Primary Examiner* — David S Blum
(74) *Attorney, Agent, or Firm* — Slater Matsil, LLP

(57) ABSTRACT

A method includes forming a metal seed layer on a dielectric layer, and forming a patterned mask over the metal seed layer. An opening in the patterned mask is over a first portion of the dielectric layer, and the patterned mask overlaps a second portion of the dielectric layer. The method further includes plating a metal region in the opening, removing the patterned mask to expose portions of the metal seed layer, etching the exposed portions of the metal seed layer, performing a plasma treatment on a surface of the second portion of the dielectric layer, and performing an etching process on the surface of the second portion of the dielectric layer.

20 Claims, 27 Drawing Sheets

(56) References Cited

U.S. PATENT DOCUMENTS

2016/0379965 A1 12/2016 Chen et al.
2017/0110421 A1* 4/2017 Liu ...................... H01L 21/561
2019/0067086 A1* 2/2019 Liu ................... H01L 21/76807

* cited by examiner

PROCESSES FOR REDUCING LEAKAGE AND IMPROVING ADHESION

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. Since the sizes of the dies are becoming increasingly smaller, and the respective packages can only be fan-in type packages, in which the I/O pads of each die are limited to the region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged. An advantageous feature of this packaging technology is the possibility of forming fan-out packages, which means the I/O pads on a die can be redistributed to a greater area than the die, and hence the number of I/O pads packed on the surfaces of the dies can be increased. Another advantageous feature of this packaging technology is that "known-good-dies" are packaged, and defective dies are discarded, and hence cost and effort are not wasted on the defective dies.

In a fan-out package, a device die is encapsulated in a molding compound, which is then planarized to expose the device die. Dielectric layers are formed over the device die. Redistribution lines are formed in the dielectric layers to connect to the device die. The fan-out package may also include through-vias penetrating through the molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
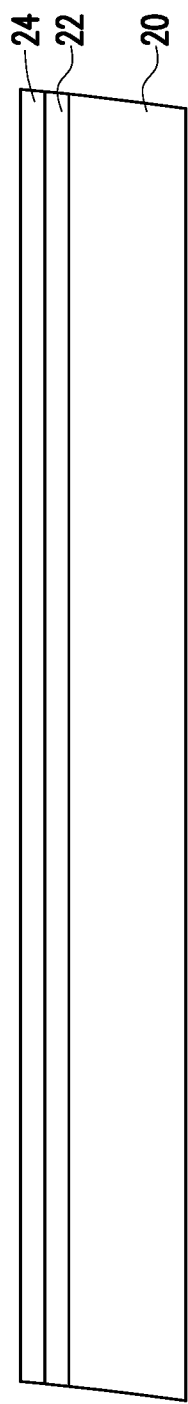
FIGS. 1 through 16 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An Integrated Fan-Out (InFO) package and the method of forming the same are provided in accordance with various exemplary embodiments. The intermediate stages of forming the InFO package are illustrated in accordance with some embodiments. Some variations of some embodiments are discussed. Throughout the various views and illustrative embodiments, like reference numbers are used to designate like elements.

Figure 25:
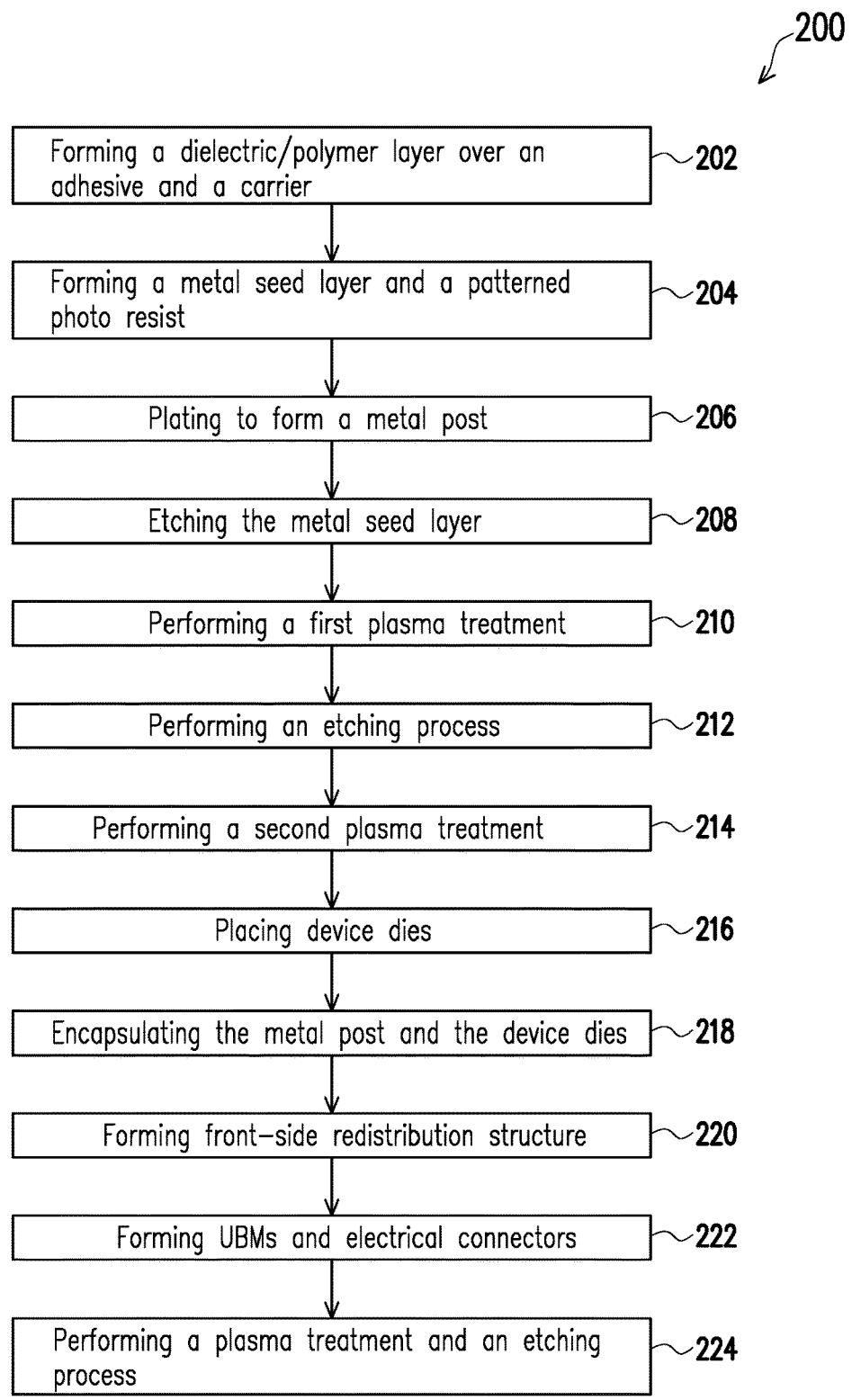
FIG. 25 illustrates a process flow for forming a package in accordance with some embodiments.

FIGS. 1 through 16 illustrate the cross-sectional views of intermediate stages in the formation of a package in accordance with some embodiments. The steps shown in FIG. 1 through 16 are also illustrated schematically in the process flow 200 shown in FIG. 25.

Referring to FIG. 1, carrier 20 is provided, and release film 22 is coated on carrier 20. The respective process is illustrated as process 202 in the process flow shown in FIG. 25. Carrier 20 is formed of a transparent material, and may be a glass carrier, a ceramic carrier, an organic carrier, or the like. Carrier 20 may have a round top-view shape. Release film 22 may be in physical contact with the top surface of carrier 20. Release film 22 may be formed of a Light-To-Heat-Conversion (LTHC) coating material, and may be applied onto carrier 20 through coating. In accordance with some embodiments of the present disclosure, the LTHC coating material is capable of being decomposed under the heat of light/radiation (such as laser), and hence can release carrier 20 from the structure formed thereon.

In accordance with some embodiments of the present disclosure, as shown in FIG. 1, dielectric buffer layer 24 is formed on LTHC coating material 22. The respective process is also illustrated as process 202 in the process flow shown in FIG. 25. In accordance with some embodiments of the present disclosure, dielectric buffer layer 24 is formed of an organic material, which may be a polymer such as polybenzoxazole (PBO), polyimide, benzocyclobutene (BCB), or the like.

Figure 2:
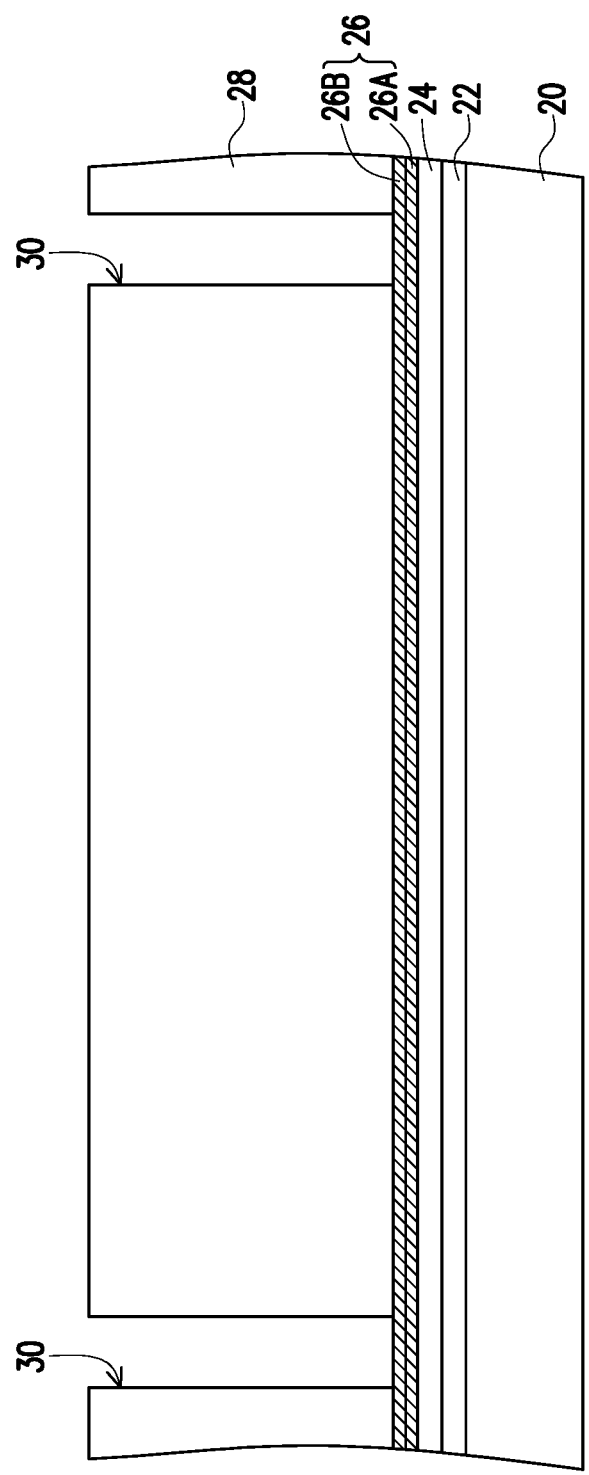

FIGS. 2 through 5 illustrate the formation of metal posts 32. Referring to FIG. 2, metal seed layer 26 is formed, for example, through Physical Vapor Deposition (PVD). The respective process is illustrated as process 204 in the process flow shown in FIG. 25. Metal seed layer 26 is formed as a blanket layer, which may include adhesion layer 26A and copper-containing layer 26B over adhesion layer 26A. Adhesion layer 26A includes a metal different from copper, and may include titanium, tantalum, titanium nitride, tantalum nitride, or the like. Copper-containing layer 26B may be formed of pure or substantially pure copper (for example, with copper percentage greater than about 95 percent) or a copper alloy. Patterned photo resist 28 is formed over metal seed layer 26, and openings 30 are formed, for example, through a light-exposure and development. The respective process is also illustrated as process 204 in the process flow shown in FIG. 25.

Figure 3:
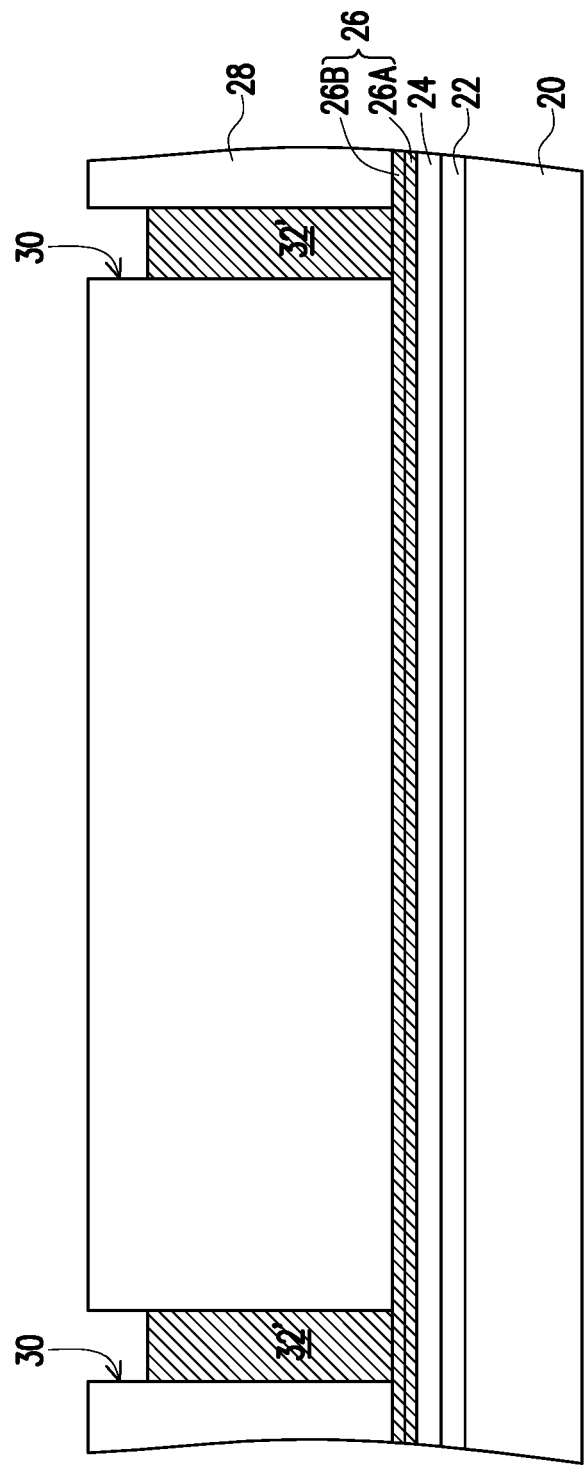

Next, as shown in FIG. 3, metal posts 32' are formed in openings 30, for example, through plating, which may be Electro-Chemical Plating (ECP) or Electro-less Plating. The respective process is illustrated as process 206 in the process flow shown in FIG. 25. Metal posts 32' may be formed of copper or a copper alloy. The plated metallic material may be copper or a copper alloy. The top surfaces of metal posts 32' are lower than the top surface of photo resist 28, so that the shapes of metal posts 32' are confined by openings 30. Metal posts 32' may have substantially vertical and straight edges. After the plating for forming metal posts 32', photo resist 28 is removed.

Figure 4:
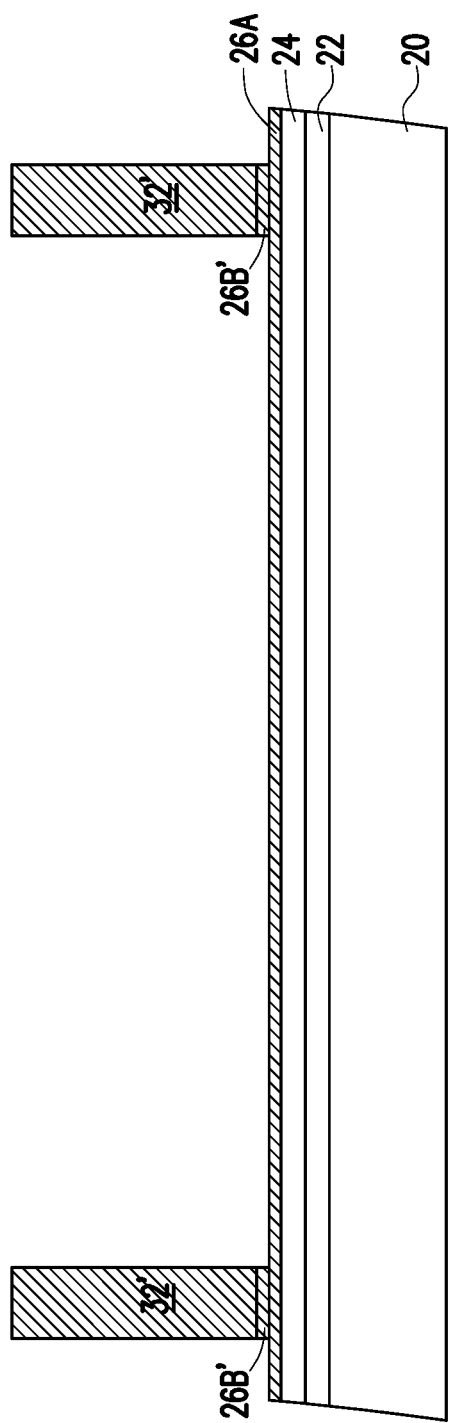

Next, the portions of copper-containing layer 26B directly underlying the removed photo resist 28 are removed. The respective process is illustrated as process 208 in the process flow shown in FIG. 25. The resulting structure is illustrated in FIG. 4. The remaining portions of copper-containing layer 26B are referred to as 26B'. The etching may be wet etching or dry etching, and may include an isotropic etching process. The etching chemical may include the mixture of $H_3PO_4$/ $H_2O_2$/$H_2O$, the mixture of $H_2SO_4$/$H_2O_2$/$H_2O$, the mixture of $(NH_4)_2S_2O_8$/$H_2O$, or the chemical selected from HCl (in $H_2O$), the mixture of $HCl$/$CuCl_2$, $FeCl_3$, or combinations thereof.

After the etching of copper-containing layer 26B, adhesion layer 26A is exposed. A second etching process is then performed, resulting in the structure shown in FIG. 5. Adhesion layer 26A may be etched through wet etch. The etching chemical/solution is selected to attack adhesion layer 26A, and does not attack copper-containing seed layer 26B and metal posts 32'. The etching chemical/solution may include the solution of HF, a mixture of HF/$H_2O_2$, $H_2O_2$ (with some other additives), $NaHCO_3$, NaOH, a mixture of $NaHCO_3$/$H_2O_2$, a mixture of $NaHCO_3$/NaOH/$H_2O_2$, or an alkali metal hydroxide aqueous solution. The alkali metal hydroxide aqueous solution may be the solution of NaOH, KOH, or the like. Throughout the description, the remaining portions 26A' and 26B' of copper seed layer 26 and the overlying metal posts 32' are in combination referred to as metal posts 32.

Figure 9:
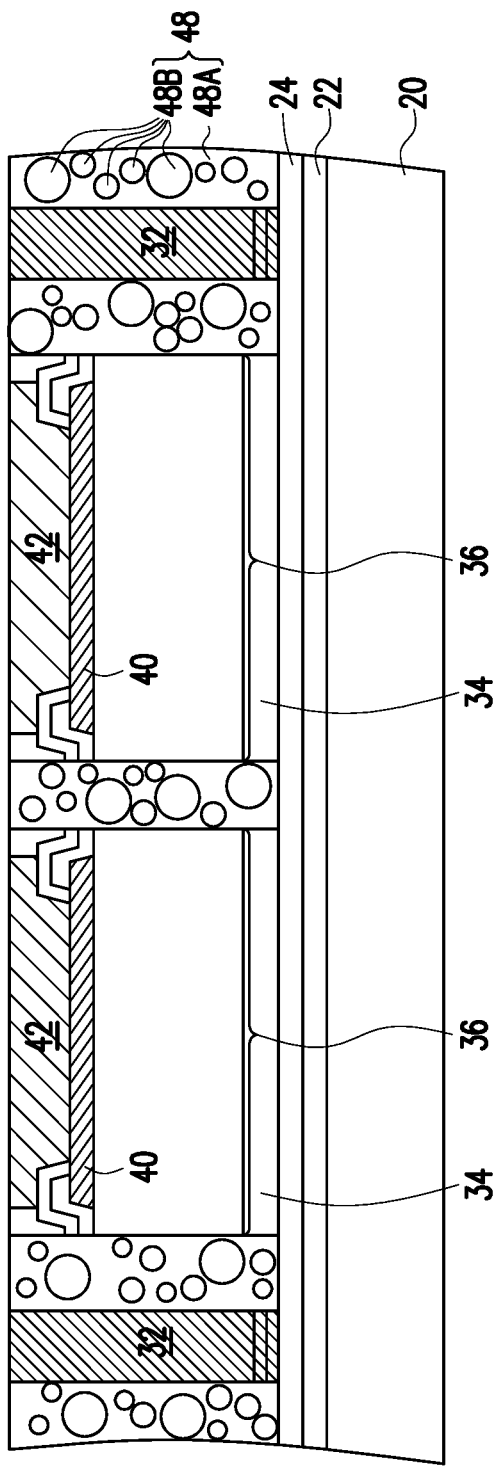

After the etching of adhesion layer 26A, there may be metal-containing particles left, which are the residue of adhesion layer 26A left on dielectric buffer layer 24. The metal-containing particles are represented as 29 in FIG. 5. Metal-containing particles 29 may comprise titanium, tantalum, titanium nitride, tantalum nitride, or the like, depending on the composition of adhesion layer 26A. Metal-containing particles 29 are electrically conductive, and hence adversely increase the leakage current in the resulting package. Metal-containing particles 29, being relatively loose, may also cause the delamination between dielectric buffer layer 24 and the subsequently dispensed encapsulating material 48 (FIG. 9). Particularly, since encapsulating material 48 and dielectric buffer layer 24 are different types of materials, and the adhesion between different types of materials are typically not as good as the adhesion between two layers formed of a same type of material, the adhesion between encapsulating material 48 and dielectric buffer layer 24 are likely to be not good regardless of metal-containing particles 29 exist or not. The generation of metal-containing particles 29 further worsens the adhesion. The degraded adhesion is thus avoided in accordance with some embodiments of the present disclosure by removing metal-containing particles 29.

Figure 5:
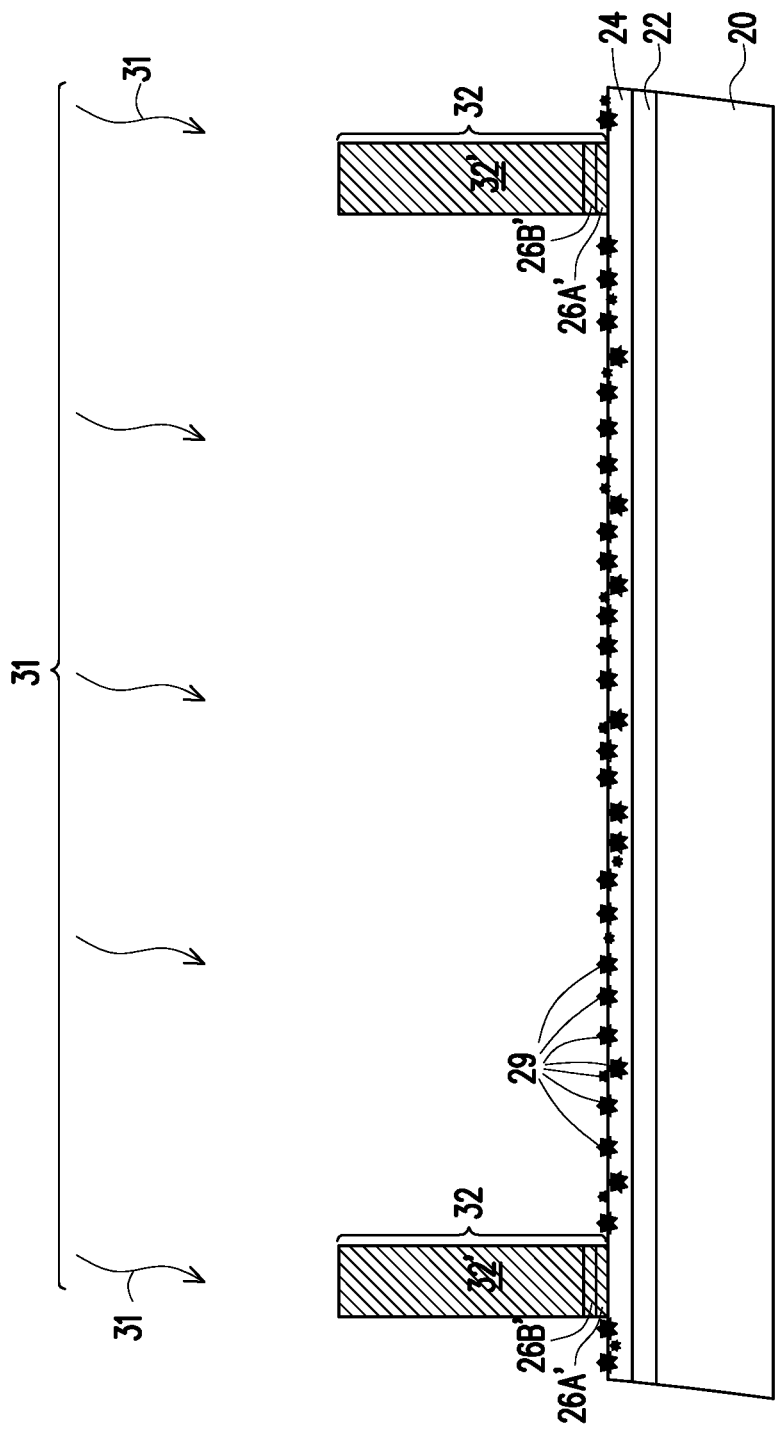

Referring to FIG. 5, a (first plasma) treatment, which is represented by arrows 31, is performed. The respective process is illustrated as process 210 in the process flow shown in FIG. 25. In accordance with some embodiments of the present disclosure, the treatment is a dry process, which is achieved through a plasma treatment, in which dielectric buffer layer 24 are bombarded. The process gas for generating the plasma may include nitrogen ($N_2$), Argon (Ar), combinations thereof, or the like. Oxygen ($O_2$) may also be added in addition to the aforementioned process gases. The bombardment has the function of loosening the metal-containing particles 29 and increasing surface roughness of dielectric buffer layer 24. The oxygen has the function of further increasing the roughness of dielectric buffer layer 24. Increasing the surface roughness of dielectric buffer layer 24 results in the improvement in the adhesion of dielectric buffer layer 24 and the subsequently dispensed encapsulating material. It is appreciated that due to the bombardment effect, some metal-containing particles 29 may be sputtered to attach to the sidewalls of metal posts 32.

In accordance with some embodiments of the present disclosure, the plasma treatment is performed by applying a Radio-Frequency (RF) power having a frequency in the range between about 1 KHz and about 103 MHz in order to generate the plasma. Furthermore, a DC bias power (and voltage) is applied to make the movement of the ions in the plasma to be directional in order to bombard dielectric buffer layer 24. The DC bias power and voltage are selected to be high enough to loosen metal-containing particles 29 and to make the surface of dielectric buffer layer 24 to be rough enough, but not too high to result in the by-products produced through the treatment to become contamination so as to worse surface adhesion. For example, the DC bias power may be in the range between about 100 Watts and about 1,000 Watts. The plasma treatment may last for a period of time in the range between about 30 seconds and about 3 minutes. The flow rate of the process gas may be in the range between about 100 sccm and about 1,000 sccm.

Figure 6:
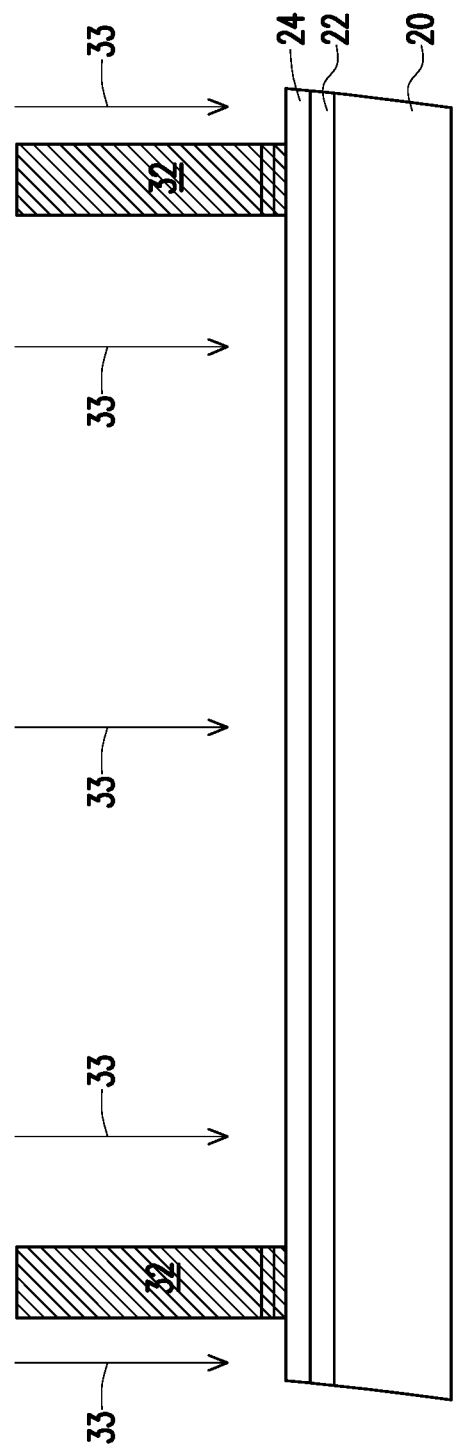

After the treatment, an etching process (represented by arrow 33) may be performed, as shown in FIG. 6. The respective process is illustrated as process 212 in the process flow shown in FIG. 25. The etching process may be a wet etching process or a dry etching process. The chemical may be selected from the same group of candidate chemicals for etching adhesion layer 26A. In accordance with some embodiments of the present disclosure, the etching is performed through a wet etching process, and may include the solution of HF, a mixture of HF/$H_2O_2$, $H_2O_2$ (with some other additives), $NaHCO_3$, NaOH, a mixture of $NaHCO_3/H_2O_2$, a mixture of $NaHCO_3/NaOH/H_2O_2$, or an alkali metal hydroxide aqueous solution. The etching may use the same or different chemical for etching adhesion layer 26A. The etching duration depends on the type of metal-containing particles 29 and the type of chemical for the wet etching. For example, when HF is used for the wet etching, the etching may last for a period of time in the range between about 10 seconds and about 3 minutes.

In the etching process, the loosened metal-containing particles 29 are etched, so that the amount of metal-containing particles 29 on/in dielectric buffer layer 24 is reduced. Furthermore, if metal-containing particles 29 are sputtered to the sidewalls of metal posts 32 (during the step shown in FIG. 5), the sputtered metal-containing particles 29 are also etched.

Figure 7:
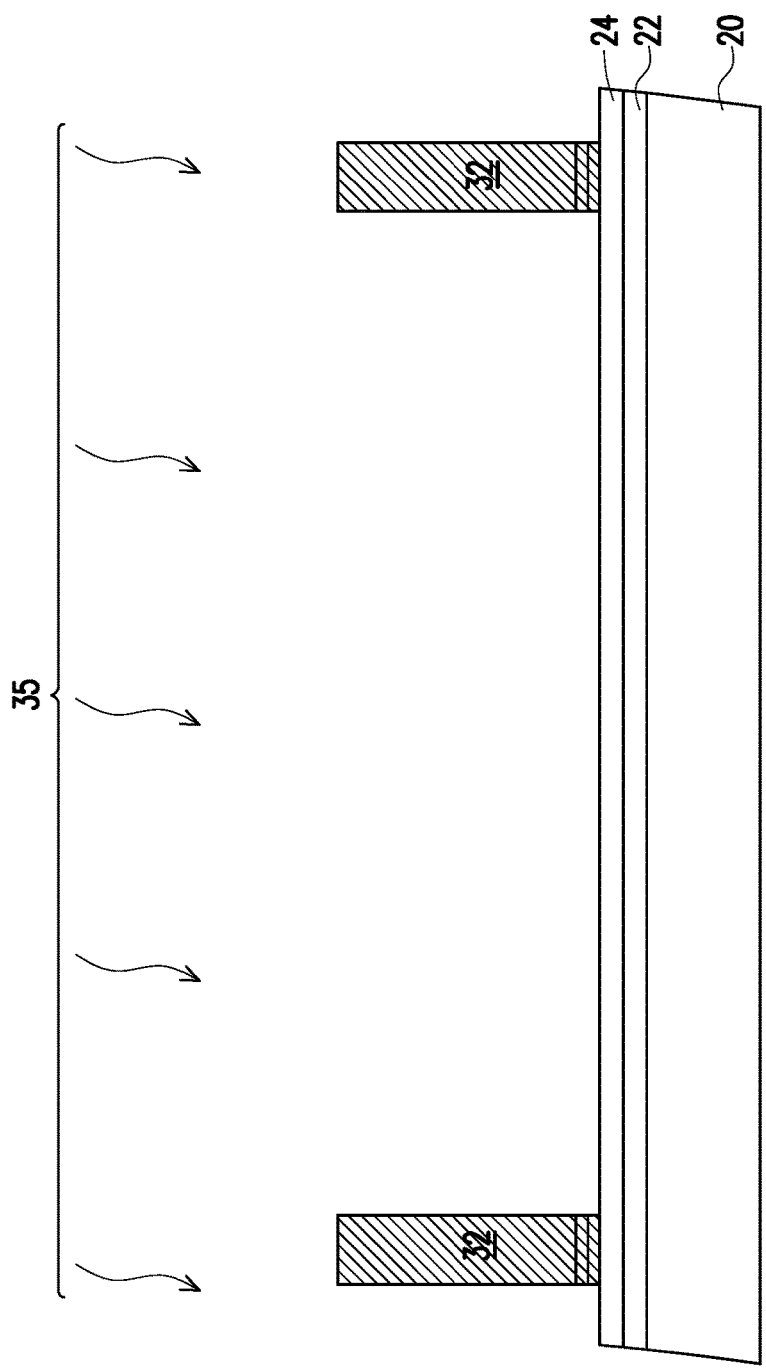

FIG. 7 illustrates a second treatment (represented by arrows 35) performed after the etching. The respective process is illustrated as process 214 in the process flow shown in FIG. 25. The second treatment has the function of oxidizing a surface layer of metal posts 32 to form a thin oxide layer on the surface of metal posts 32, so that the adhesion between metal posts 32 and the subsequently dispensed encapsulating material 48 (FIG. 9) is improved. In accordance with some embodiments of the present disclosure, the second treatment comprises a plasma treatment, with the process gases including oxygen ($O_2$) and an additional gas such as $N_2$, Ar, or the like. The second treatment may be performed using the same process gases as the first treatment, or performed using process gases different from that are used in the first treatment. The second treatment is not for bombarding dielectric buffer layer 24. Accordingly, the bias power (or voltage) in the second treatment is lower than the bias power (or voltage) used in the first treatment. For example, the bias power (or voltage) in the second treatment is lower than 50 percent, or lower than 30 percent, of the bias power (or voltage) used in the first treatment. In accordance with some embodiments of the present disclosure, there is no bias power/voltage applied in the second treatment. It is appreciated that although the first treatment, when oxygen is added, also has the effect of oxidizing the surface layer of metal posts 32, the formed metal oxide is removed in the wet etching process. The second treatment is thus performed to re-form the metal oxide layer (not shown) on the surface of metal posts 32.

Figure 8:
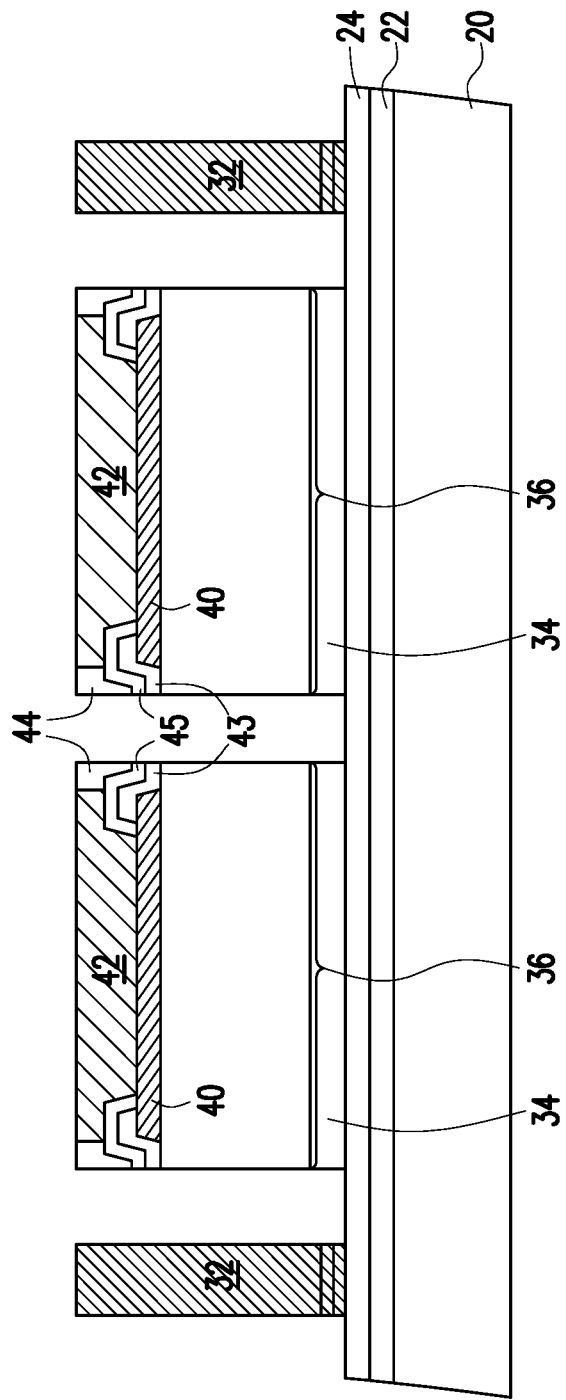

FIG. 8 illustrates the placement/attachment of devices 36 (alternatively referred to as package components). The respective process is illustrated as process 216 in the process flow shown in FIG. 25. Devices 36 may be device dies, and hence are referred to as device dies 36 hereinafter, while devices 36 may also be packages, die stacks, or the like. Device dies 36 are attached to dielectric buffer layer 24 through Die-Attach Films (DAFs) 34, which are adhesive films pre-attached on device dies 36 before device dies 36 are placed on dielectric buffer layer 24. Device dies 36 may include semiconductor substrates having back surfaces (the surface facing down) in physical contact with the respective underlying DAFs 34. Device dies 36 may include integrated circuit devices such as active devices, which include transistors (not shown) at the front surface (the surface facing up) of the semiconductor substrate. In accordance with some embodiments of the present disclosure, device dies 36 include one or more logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. Since carrier 20 is a wafer-level carrier, although two device dies 36 are illustrated, a plurality of identical groups of device dies 36 may be placed over dielectric buffer layer 24 in the die-placement step, and the device die groups may be allocated as an array including a plurality of rows and a plurality of columns.

In accordance with some exemplary embodiments, metal pillars 42 (such as copper pillars) are pre-formed as parts of device dies 36, and metal pillars 42 are electrically coupled to the integrated circuit devices such as transistors (not shown) in device die 36 through the underlying metal pads 40, which may be, for example, aluminum pads. Although one metal pad 40 and one metal pillar 42 are illustrated as in each of devices 36, each of device dies 36 may include a plurality of metal pads and a plurality of overlying metal pillars 42. In accordance with some embodiments of the present disclosure, a dielectric layer such as polymer layer 44 fills the gaps between neighboring metal pillars 42 in the same device die as a top dielectric layer. Passivation layer 43 may also be formed underlying polymer layer 44. Top dielectric layer 44 may also include a portion covering and protecting metal pillars 42. Polymer layer 44 may be formed of PBO or polyimide in accordance with some embodiments of the present disclosure. It is appreciated that device dies 36 may have different design including different top dielectric layers, which are contemplated by the embodiments of the present disclosure. For example, dielectric layer 45, which may be a polymer layer formed of polyimide, PBO, or the like, may be formed or omitted, which embodiments are also contemplated.

Next, referring to FIG. 9, device dies 36 and metal posts 32 are encapsulated in encapsulating material 48. The respective process is illustrated as process 218 in the process flow shown in FIG. 25. Accordingly, metal posts 32 are referred to as through-vias thereinafter. Encapsulating material 48 fills the gaps between neighboring through-vias 32 and the gaps between through-vias 32 and device dies 36. Encapsulating material 48 may be a molding compound, a molding underfill, an epoxy, and/or a resin. The top surface of the dispensed encapsulating material 48 is higher than the top ends of metal pillars 42 and through-vias 32. Encapsulating material 48 may include base material 48A, which may be a polymer, a resin, an epoxy, or the like, and filler particles 48B in the base material 48A. The filler particles may be particles of a dielectric material(s) such as $SiO_2$, $Al_2O_3$, silica, or the like, and may have spherical shapes. Also, the spherical filler particles 48B may have the same or different diameters, as illustrated in accordance with some examples.

In a subsequent step, as also shown in FIG. 9, a planarization step such as a Chemical Mechanical Polish (CMP) step or a mechanical grinding step is performed to thin encapsulating material 48 and dielectric layer 44, until through-vias 32 and metal pillars 42 are all exposed. Through-vias 32 and metal pillars 42 may also be polished slightly to ensure the exposure of both through-vias 32 and metal pillars 42. Due to the planarization process, the top ends of through-vias 32 are substantially level (coplanar) with the top surfaces of metal pillars 42, and are substantially coplanar with the top surface of encapsulating material 48. Due to the planarization process, some filler particles 48B at the top of the molded encapsulating material 48 are polished partially, causing some of the filler particles 48B to have the top portions removed, and bottom portions remaining, as shown in FIG. 9. The resulting partial filler particles 48B will thus have top surfaces to be planar, which planar top surfaces are coplanar with the top surface of base material 48A, through-vias 32, and metal pillars 42.

Figure 10:
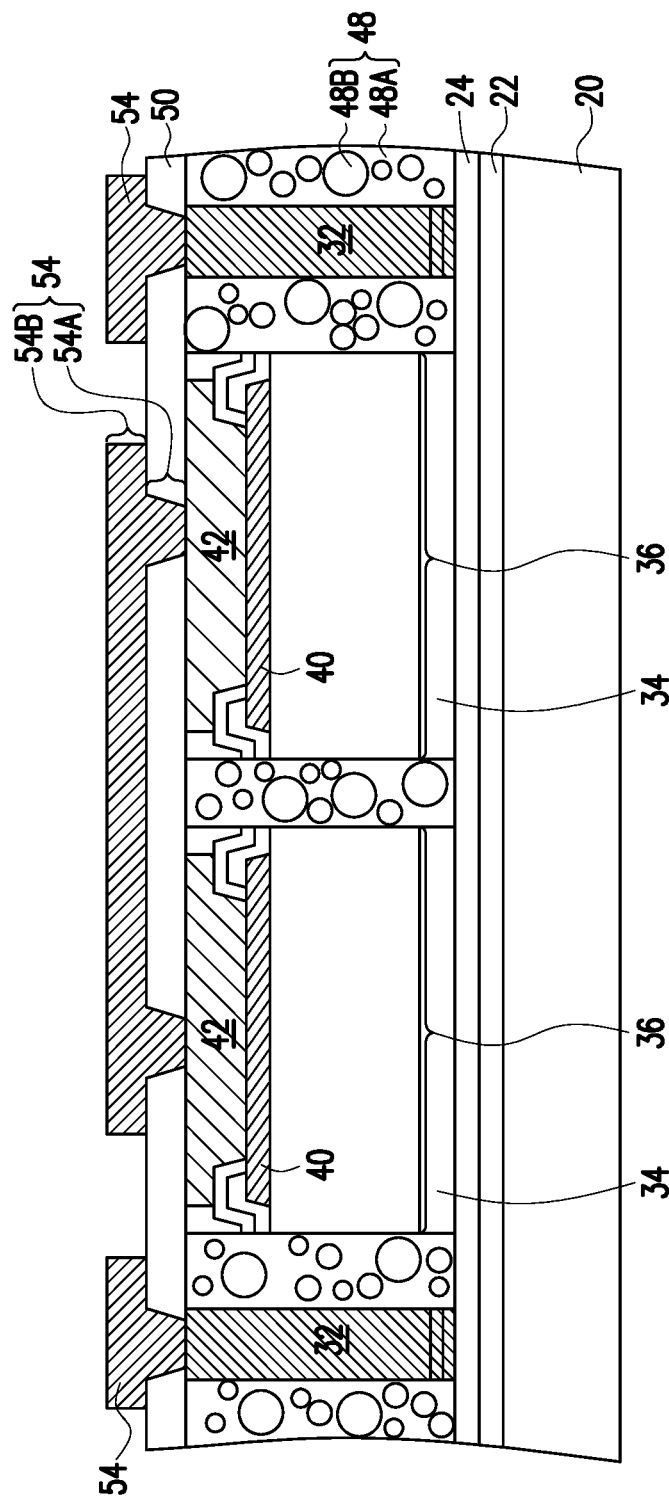

FIGS. 10 through 13 illustrate the formation of a front-side redistribution structure. The respective process is illustrated as process 220 in the process flow shown in FIG. 25. FIG. 10 illustrates the formation of a first layer of Redistribution Lines (RDLs) 54 and the respective dielectric layer 50. In accordance with some embodiments of the present disclosure, dielectric layer 50 is first formed on the structure shown in FIG. 9. Dielectric layer 50 may be formed of a polymer such as PBO, polyimide, or the like. The formation process includes coating dielectric layer 50 in a flowable form, and then curing dielectric layer 50. In accordance with alternative embodiments of the present disclosure, dielectric layer 50 is formed of an inorganic dielectric material such as silicon nitride, silicon oxide, or the like. The formation method may include Chemical Vapor Deposition (CVD), Atomic Layer Deposition (ALD), Plasma-Enhanced Chemical Vapor Deposition (PECVD), or other applicable deposition methods. Openings (occupied by the via portions of RDLs 54) are then formed, for example, through a photo lithography process. In accordance with some embodiments in which dielectric layer 50 is formed of a photo sensitive material such as PBO or polyimide, the formation of the openings involves a photo exposure of dielectric layer 50 using a lithography mask (not shown), and developing dielectric layer 50. Through-vias 32 and metal pillars 42 are exposed through the openings.

Next, RDLs 54 are formed over dielectric layer 50. RDLs 54 include vias 54A formed in dielectric layer 50 to connect to metal pillars 42 and through-vias 32, and metal traces (metal lines) 54B over dielectric layer 50. In accordance with some embodiments of the present disclosure, RDLs 54 (including 54A and 54B) are formed in a plating process, which includes depositing a metal seed layer (not shown), forming and patterning a photo resist (not shown) over the metal seed layer, and plating a metallic material such as copper and/or aluminum over the metal seed layer. The metal seed layer may also include an adhesion layer and a copper-containing layer, whose formation methods and materials are similar to that of metal seed layer 26 (FIG. 2). The patterned photo resist is then removed, followed by etching the portions of the metal seed layer previously covered by the patterned photo resist.

In accordance with some embodiments of the present disclosure, after the etching of the metal seed layer, no plasma treatment and wet etching process (which are disclosed referring to FIGS. 5 and 6), are performed. It is appreciated that the dielectric layer that will be formed over and contacting dielectric layer 50 may be formed of the same type of material as dielectric layer 50, and hence their adhesion is usually good enough, and hence there is no need to further improve the roughness through the plasma treatment. In accordance with alternative embodiments, the plasma treatment and the wet etching process are performed to further improve the adhesion and to reduce leakage.

Figure 11:
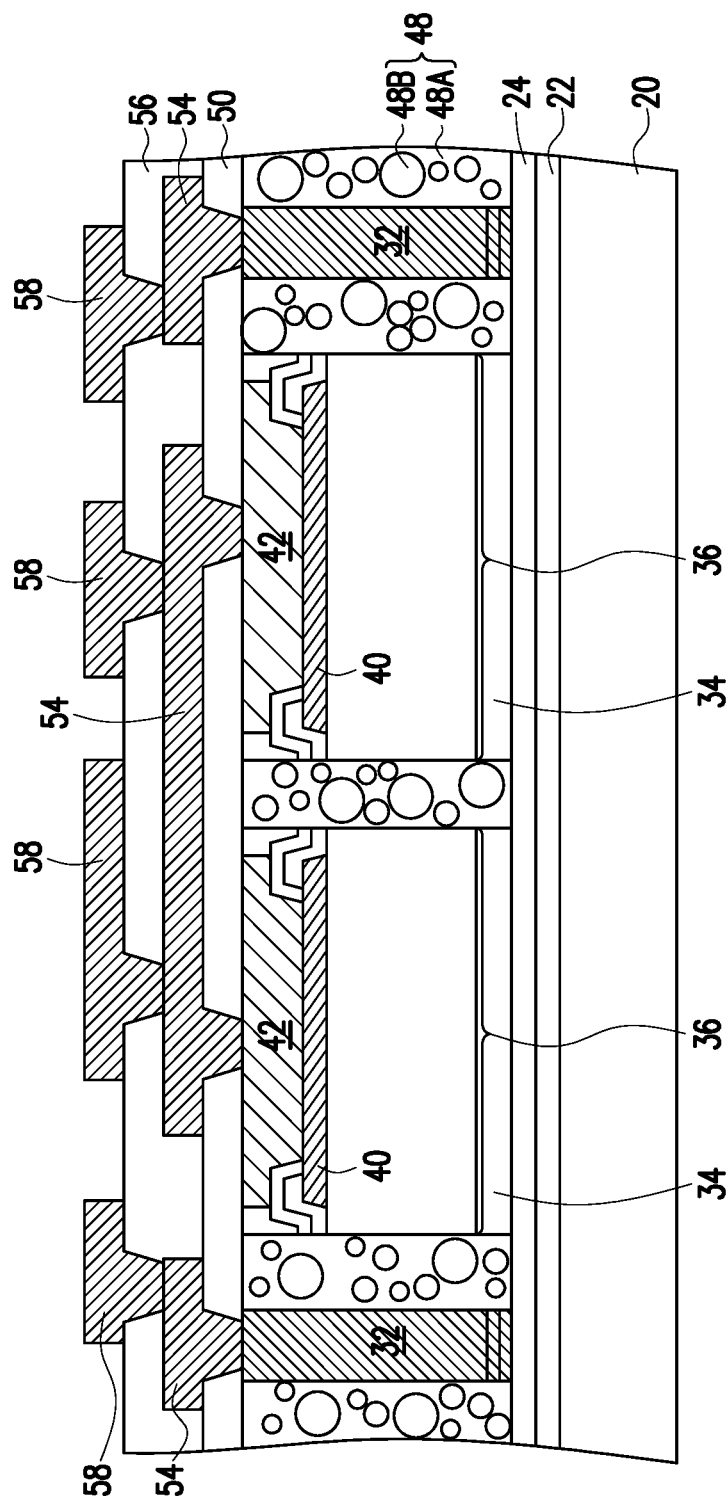

Referring to FIG. 11, in accordance with some embodiments of the present disclosure, dielectric layer 56 is formed over the structure shown in FIG. 10, followed by the formation of openings (occupied by the via portions of RDLs 58) in dielectric layer 56. Some portions of RDLs 54 are thus exposed through the openings. Dielectric layer 56 may be formed using a material selected from the same candidate materials for forming dielectric layer 50, which may include PBO, polyimide, BCB, or other organic or inorganic materials. RDLs 58 are then formed. RDLs 58 also include via portions extending into the openings in dielectric layer 56 to contact RDLs 54, and metal line portions directly over dielectric layer 56. The formation of RDLs 58 may be the same as the formation of RDLs 54, which includes forming a seed layer, forming a patterned mask, plating RDLs 58, and then removing the patterned mask and undesirable portions of the seed layer.

Figure 12:
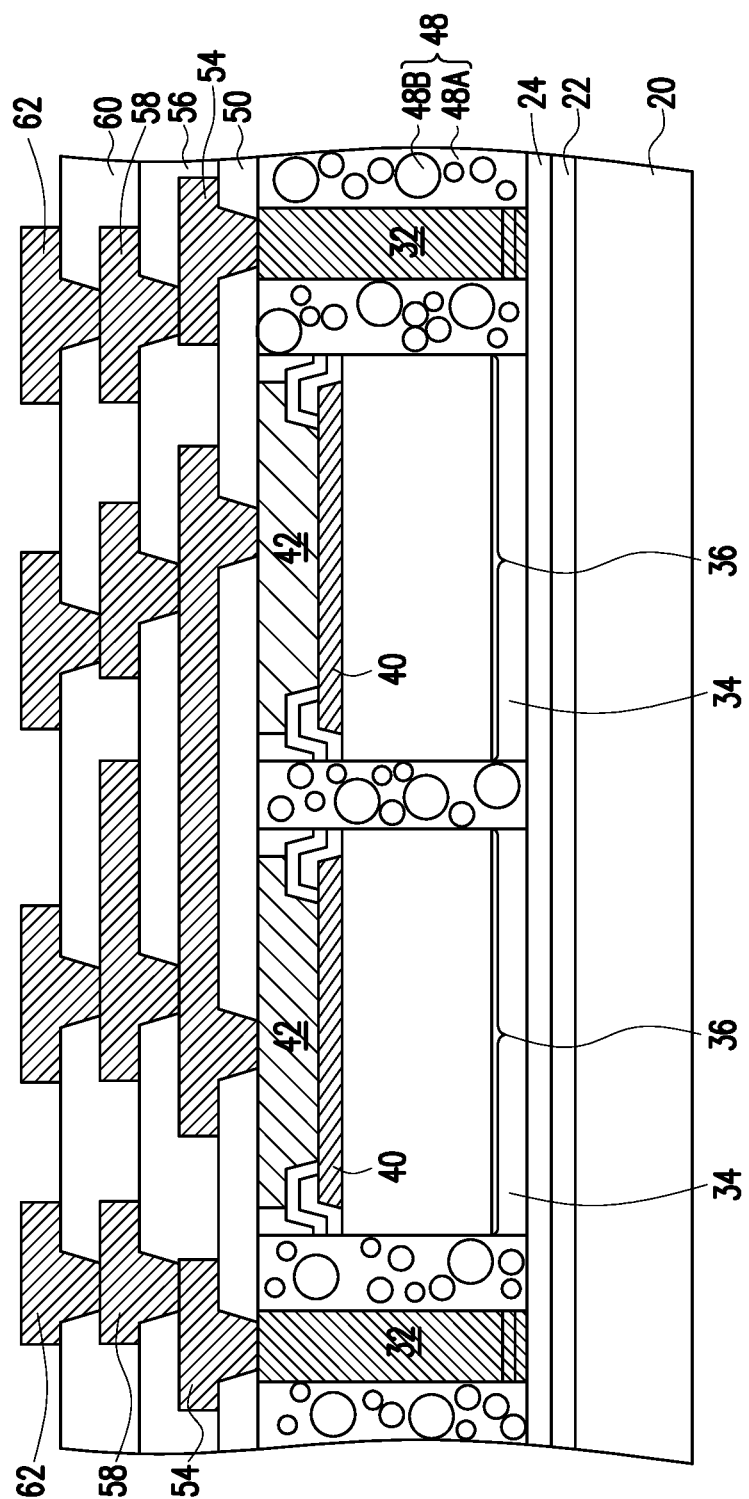

FIG. 12 illustrates the formation of dielectric layer 60 and RDLs 62 over dielectric layer 56 and RDLs 58. Dielectric layer 60 may be formed of a material selected from the same group of candidate materials for forming dielectric layers 50 and 56. RDLs 62 may also be formed of a metal or a metal alloy including aluminum, copper, tungsten, or alloys thereof. It is appreciated that although in the illustrated exemplary embodiments, three layers of RDLs (54, 58 and 62) are formed, the package may have any number of RDL layers such as one layer, two layers, or more than three layers.

Figure 13:
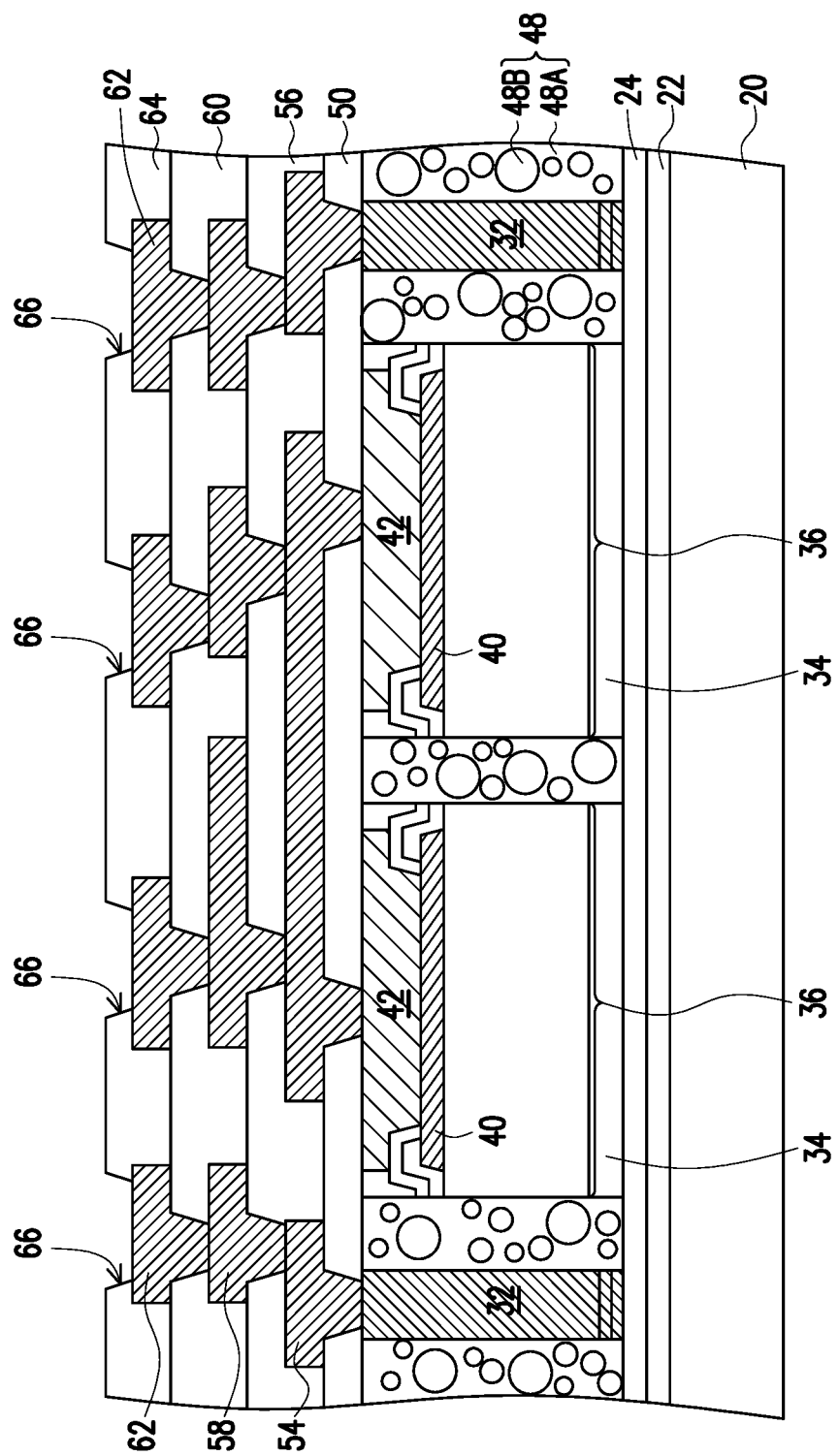

FIG. 13 illustrates the formation of dielectric layer 64. Dielectric layer 64 may be formed of a material selected from the same group of candidate materials for forming dielectric layers 50, 56, and 60. For example, dielectric layer 64 may be formed using PBO, polyimide, or BCB. Openings 66 are formed in dielectric layer 64 to reveal the underlying metal pads, which are parts of RDLs 62 in the illustrative embodiments.

Figure 14:
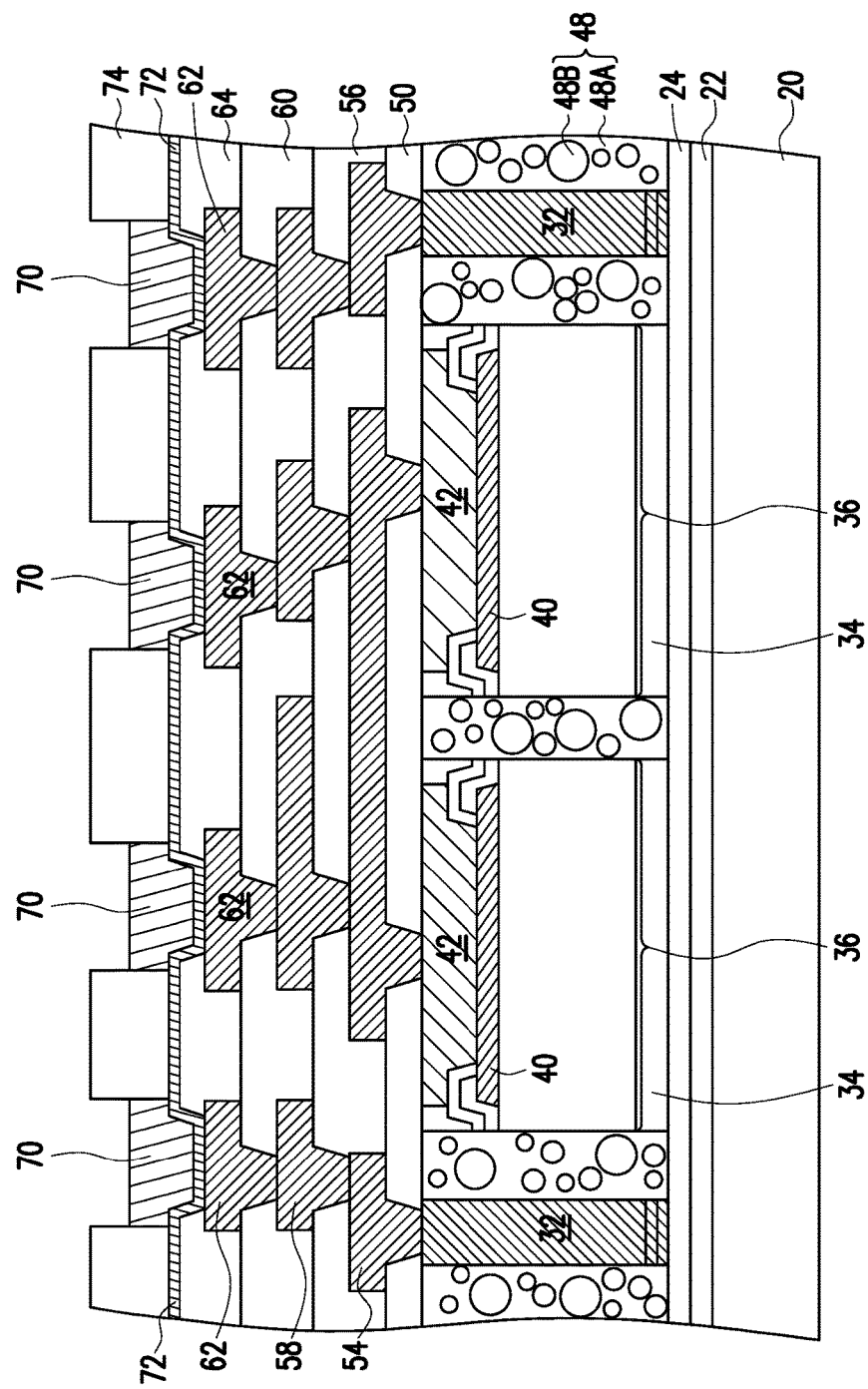
Figure 15A:
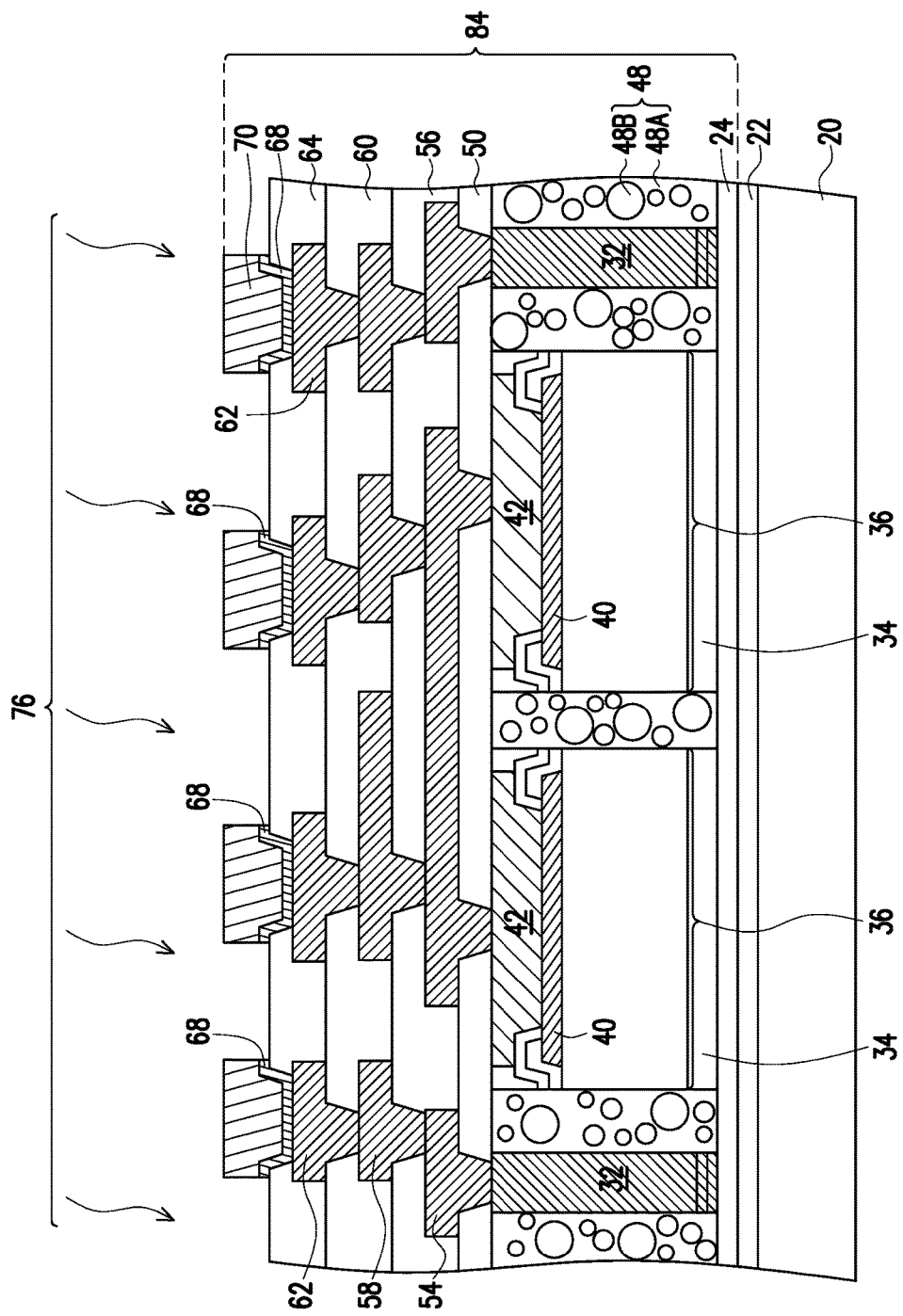

FIGS. 14 and 15A illustrates the formation of Under-Bump Metallurgies (UBMs) 68 (FIG. 15A), and electrical connectors 70 in accordance with some exemplary embodiments. The respective process is illustrated as process 222 in the process flow shown in FIG. 25. Referring to FIG. 14, seed layer 72 is formed. Seed layer 72 may have a similar structure as seed layer 26 (FIG. 2), and may include an adhesion layer and a copper-containing layer over the adhesion layer, which are formed of similar materials as discussed for seed layer 26. Seed layer 72 extends into the openings 66 (FIG. 13) to contact the metal pads in RDLs 62.

A patterned photo resist 74 is formed over seed layer 72, with openings formed to reveal some portions of seed layer 72. Next, metal pillars 70 (which are alternatively referred to electrical connectors) are formed through plating in the openings. Metal pillars 70 may be formed of a non-solder material (such as copper) or a solder. In subsequent process, photo resist 74 is removed, and the underlying portions of seed layer 72 are exposed. Etching processes are then performed to etch the exposed portions of seed layer 72. The remaining portion of the adhesion layer in seed layer 72 is referred to as UBMs 68 hereinafter. The etching process and the respective chemicals for etching seed layer 72 may be found referring to the discussion of the etching of seed layer 26, as shown in FIGS. 4 and 5.

Next, as shown in FIG. 15A, a treatment process and an etching process are performed, which processes are represented by arrows 76. The respective process is illustrated as process 224 in the process flow shown in FIG. 25. The details of the treatment and the etching process have been discussed referring to FIGS. 5 and 6, which may include a dry (plasma) treatment process and a wet etching process, respectively, and hence are not repeated herein. The treatment and the etching process have the functions of reducing the undesirable metal particles left by the etched seed layer 72 (FIG. 14), particularly the adhesion layer in seed layer 72. The treatment also has the function of increasing the surface roughness of dielectric layer 64. In accordance with some embodiments of the present disclosure in which the plated metal pillars 70 include solder, a reflow is performed, and the resulting solder regions 70 will be rounded, similar to what are shown in FIG. 15B-2.

Figures 1, 15B:
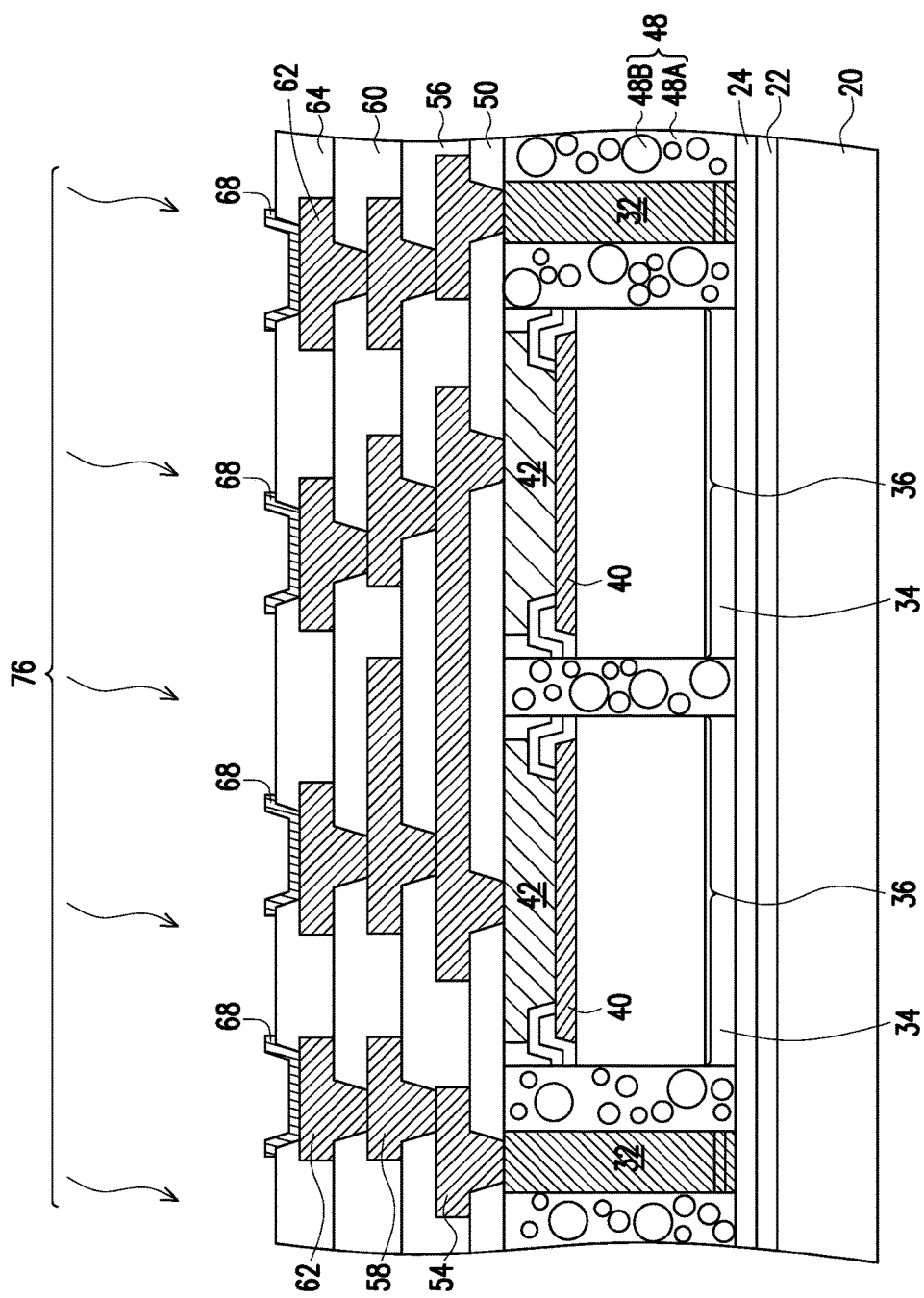
Figures 2, 15B:
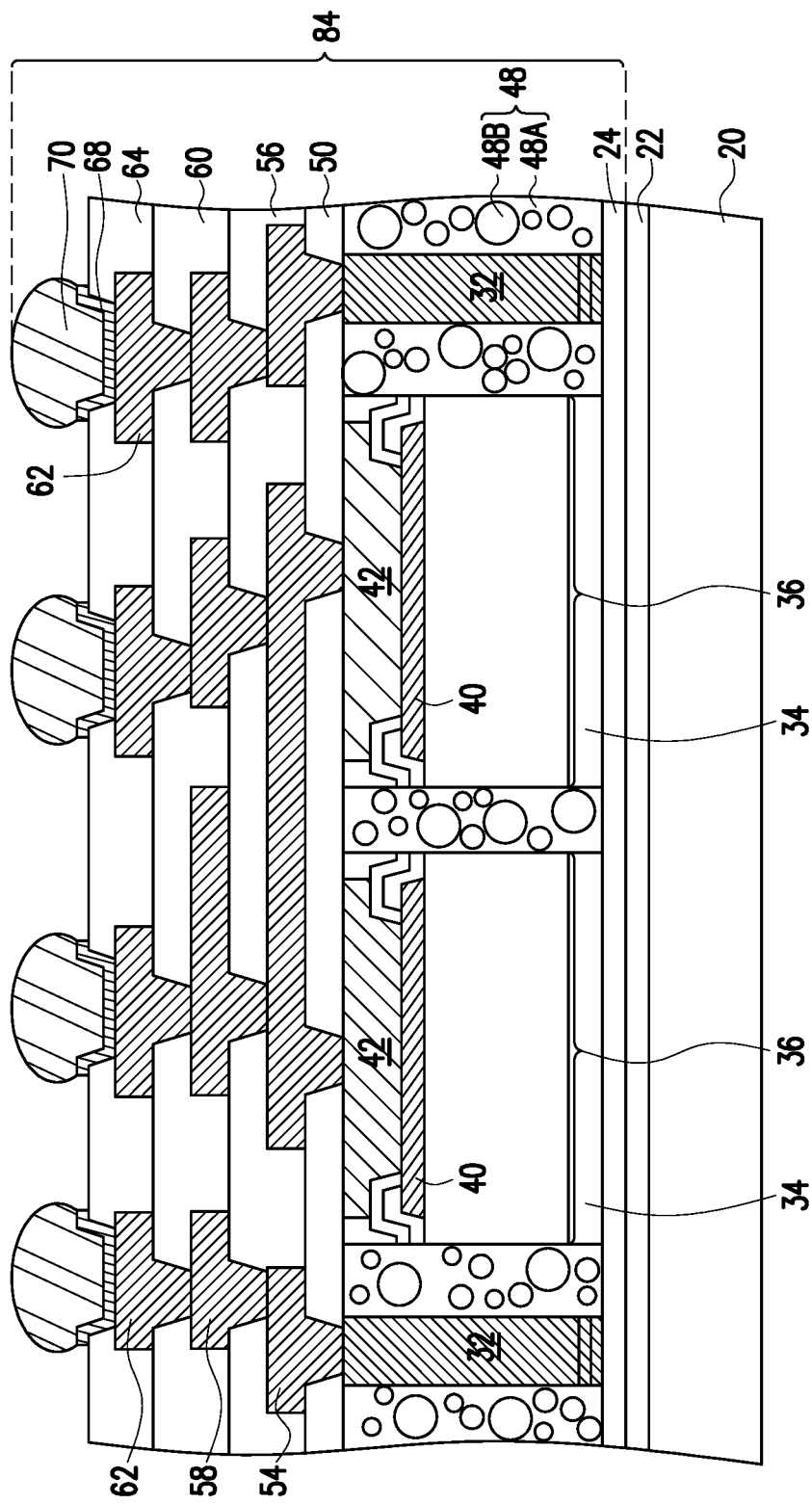

FIGS. 15B-1 and 15B-2 illustrate the intermediate stages of in the formation of UBMs 68 in accordance with some embodiments, in which, instead of having metal pillars formed as electrical connectors 70, solder regions are formed to act as electrical connectors 70. Referring to FIG. 15B-1, UBMs 68 are formed. The formation process include forming dielectric layer 64 and openings 66 as shown in FIG. 13, forming a blanket metal layer (similar to the illustrated metal seed layer 72 in FIG. 14) to extend into openings 66, forming a mask layer (such as photo resist) to cover some portions of the metal layer, and etching the portions of the seed layer exposed through the mask layer. The remaining portions of the blanket metal layer are UBMs 68. In accordance with some embodiments, the blanket metal layer (and the resulting UBMs 68) includes a nickel layer, a titanium layer, a palladium layer, a gold layer, a copper layer, or multilayers thereof.

Next, as also shown in FIG. 15B-1, a treatment process and an etching process are performed, which processes are also represented by arrows 76. The details of the treatment and the etching process are essentially the same as the process 76 shown in FIG. 15A. The details of the treatment process and an etching process have been discussed referring to FIGS. 5 and 6, respectively, and hence are not repeated herein. The treatment and the etching process have the features of reducing the undesirable metal particles left by the blanket metal layer, and increasing the surface roughness of dielectric layer 64.

Referring to FIG. 15B-2, after the treatment process and an etching process, solder regions (which are also denoted as 70) are formed. The formation may include placing solder balls on UBMs 68, and then reflowing the solder balls.

The structure including dielectric layer 24 and the overlying features in combination is referred to package 84 hereinafter, which may be a composite wafer including a plurality of structures identical to what is illustrated in FIG. 15A or 15B-2. Next, composite wafer 84 is placed on a tape (not shown), so that composite wafer 84 may be demounted from carrier 20, for example, by projecting a light (such a laser beam) on release film 22, and the light penetrates through the transparent carrier 20. The release film 22 is thus decomposed, and composite wafer 84 is released from carrier 20.

Figure 16:
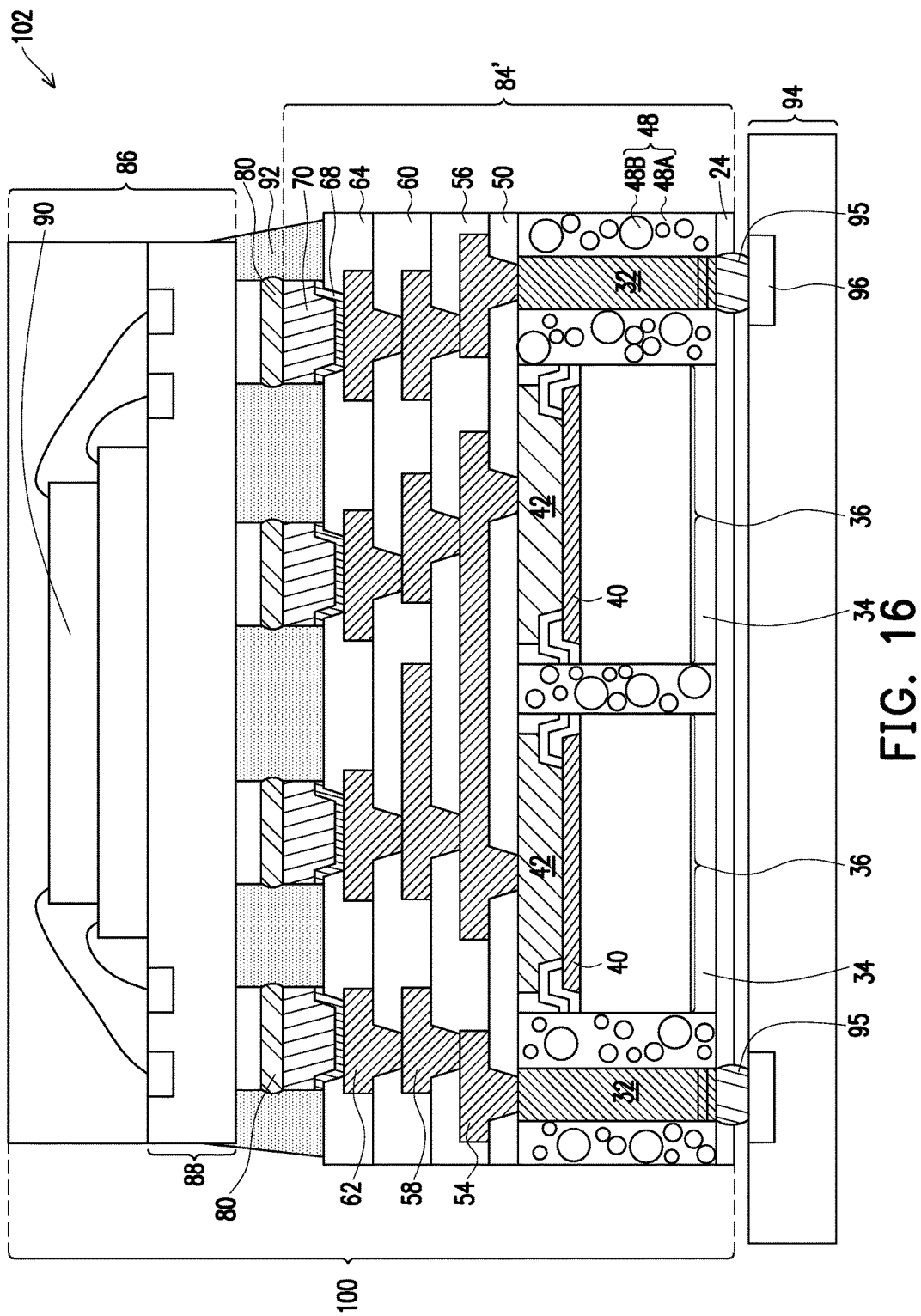

Referring to FIG. 16, openings (occupied by solder regions 95) are formed in dielectric buffer layer 24, and hence through-vias 32 are exposed. In accordance with some embodiments of the present disclosure, the openings are formed through laser drill. In accordance with alternative embodiments of the present disclosure, the openings are formed through etching in a lithography process.

Composite wafer 84 includes a plurality of packages 84' (refer to FIG. 16), which are identical to each other, with each of packages 84' including a plurality of through-vias 32 and one or more device die 36. FIG. 16 illustrates the bonding of package 86 onto package 84', thus forming a Package-on-Package (PoP) structure/package 100. The bonding is performed through solder regions 80. In accordance with some embodiments of the present disclosure, package 86 includes package substrate 88 and device die(s) 90, which may be memory dies such as Static Random Access Memory (SRAM) dies, Dynamic Random Access Memory (DRAM) dies, or the like. Underfill 92 is also disposed into the gap between package 86 and the underlying package 84', and is cured. Since underfill 92 (which may also include a resin (or an epoxy) as a base material and filler particles in the base material) is different from the material of dielectric layer 64, the adhesion therebetween is typically not good enough, and hence the processes 76 (FIGS. 15A and 15B-1) may improve the adhesion.

A singulation (die-saw) process is performed to separate composite wafer 84 and the packages 86 bonded thereon into individual packages 84', which are identical to each other. FIG. 16 also illustrates the bonding of the singulated package to package component 94 through solder regions 95. In accordance with some embodiments of the present disclosure, package component 94 is a package substrate, which may be a coreless substrate or a substrate having a core (such as a fiberglass-enforced core). In accordance with other embodiments of the present disclosure, package component 94 is a printed circuit board or a package. The package in FIG. 16 is referred to as package 102 hereinafter.

FIGS. 17 through 24 illustrate cross-sectional views of intermediate stages in the formation of packages in accordance with some embodiments of the present disclosure. Unless specified otherwise, the materials and the formation methods of the components in these embodiments are essentially the same as the like components, which are denoted by like reference numerals in the embodiments shown in FIGS. 1 through 16. The details regarding the formation processes and the materials of the components shown in FIGS. 17 through 24 may thus be found in the discussion of the embodiment shown in FIGS. 1 through 16.

Figure 17:
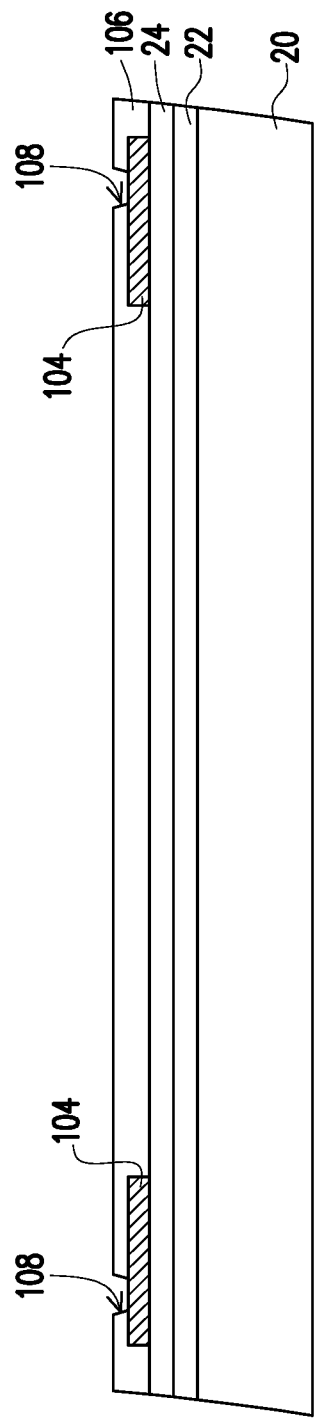
FIGS. 17 through 21 illustrate the cross-sectional views of intermediate stages in the formation of a package including backside redistribution lines in accordance with some embodiments.

FIGS. 17 through 21 illustrate the cross-sectional views of intermediate stages in the formation of a package including backside RDLs, which are formed before the encapsulation of device dies. Referring to FIG. 17, release film 22 is coated on carrier 20, and dielectric buffer layer 24 is formed over release film 22. In accordance with some embodiments of the present disclosure, dielectric layer 24 is formed of a polymer, which may be polyimide, PBO, or the like.

Next, backside RDLs 104 are formed over dielectric layer 24. The formation of RDLs 104 may include forming a metal seed layer (not shown) over dielectric layer 24, forming a patterned mask (not shown) such as a photo resist over the seed layer, and then performing a metal plating on the exposed seed layer. The patterned mask and the portions of the seed layer covered by the patterned mask are then removed, leaving RDLs 104 as in FIG. 17. In accordance with some embodiments of the present disclosure, the seed layer includes a titanium layer and a copper layer over the titanium layer. The seed layer may be formed using, for example, Physical Vapor Deposition (PVD). The plating may be performed using, for example, electro-less plating.

Next, dielectric layer 106 is formed on RDLs 104. The bottom surface of dielectric layer 106 is in contact with the top surfaces of RDLs 104 and dielectric layer 24. In accordance with some embodiments of the present disclosure, dielectric layer 106 is formed of a polymer, which may be polyimide, PBO, or the like. In accordance with alternative embodiments of the present disclosure, dielectric layer 106 is formed of a non-polymer (inorganic) material, which may be silicon oxide, silicon nitride, or the like. Dielectric layer 106 is then patterned to form openings 108 therein. Hence, some portions of RDLs 104 are exposed through the openings 108 in dielectric layer 106.

Figure 18:
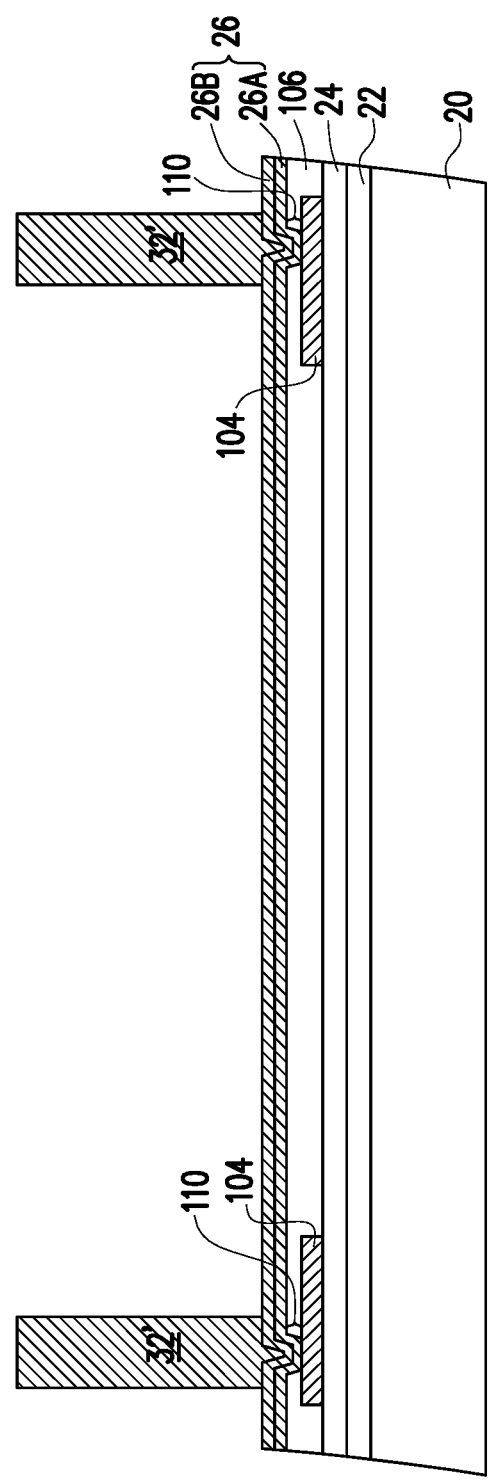

FIG. 18 illustrates the formation of metal posts. The process details and material are similar to what are shown in, and discussed referring to, FIGS. 2 through 5, and hence are not repeated herein. The resulting metal posts 32 are connected to underlying RDLs 104 through vias 110, which are in dielectric layer 106, and are formed simultaneously as metal posts 32. Also, the metal seed layer 26 (including adhesion layer 26A and copper-containing layer 26B) includes some portions in metal posts 32 and some other portions in vias 110.

Figure 19:
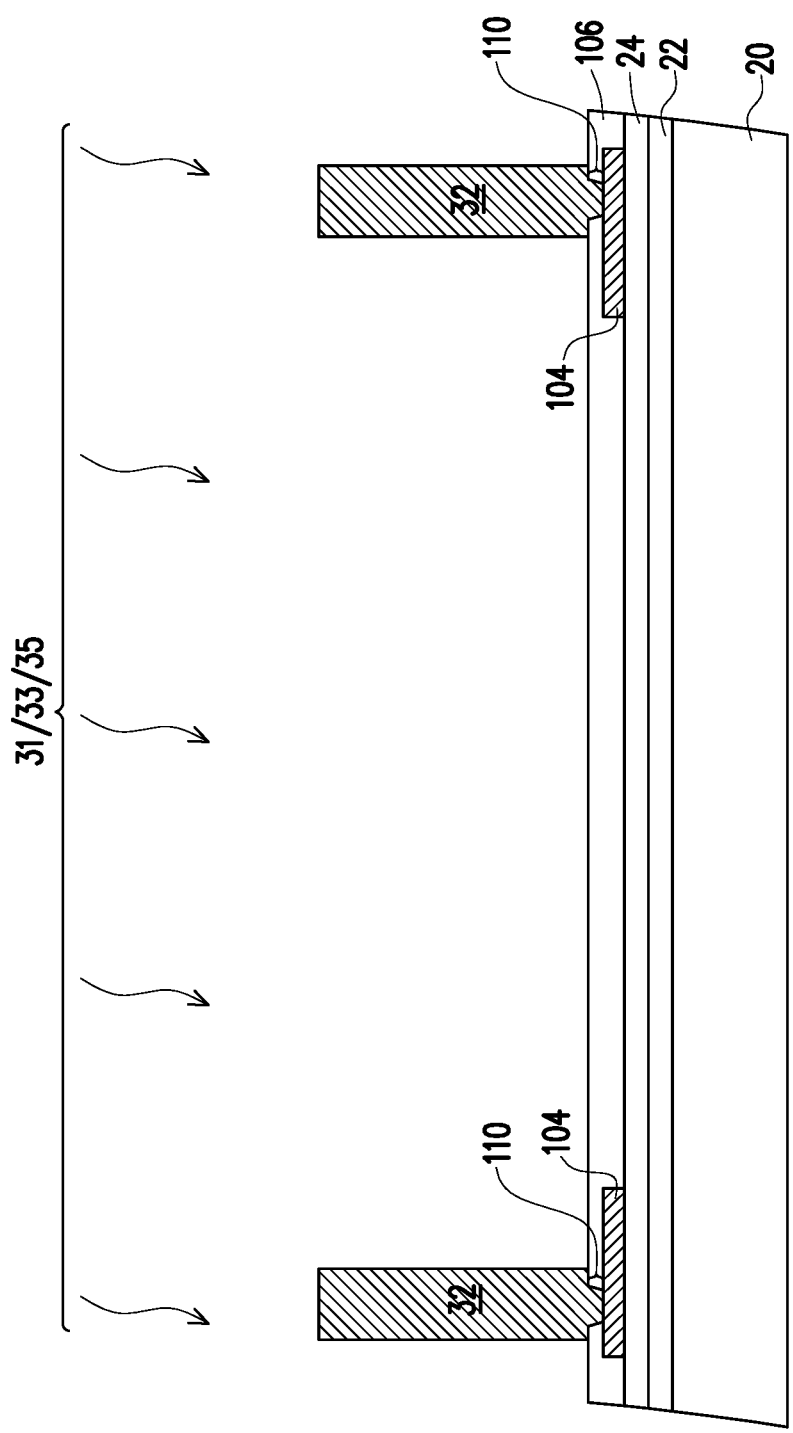

FIG. 19 illustrates a plurality of processes, which may include a first treatment 31, an etching process 33 following treatment 31, and a second treatment 35 following etching process 33. The process details of the first treatment, the etching process, and the second treatment may be found referring to FIGS. 5, 6, and 7, respectively, and are not repeated herein. Accordingly, the adverse metal particles may be removed, and the surface roughness of dielectric layer 106 is increased.

Figure 20:
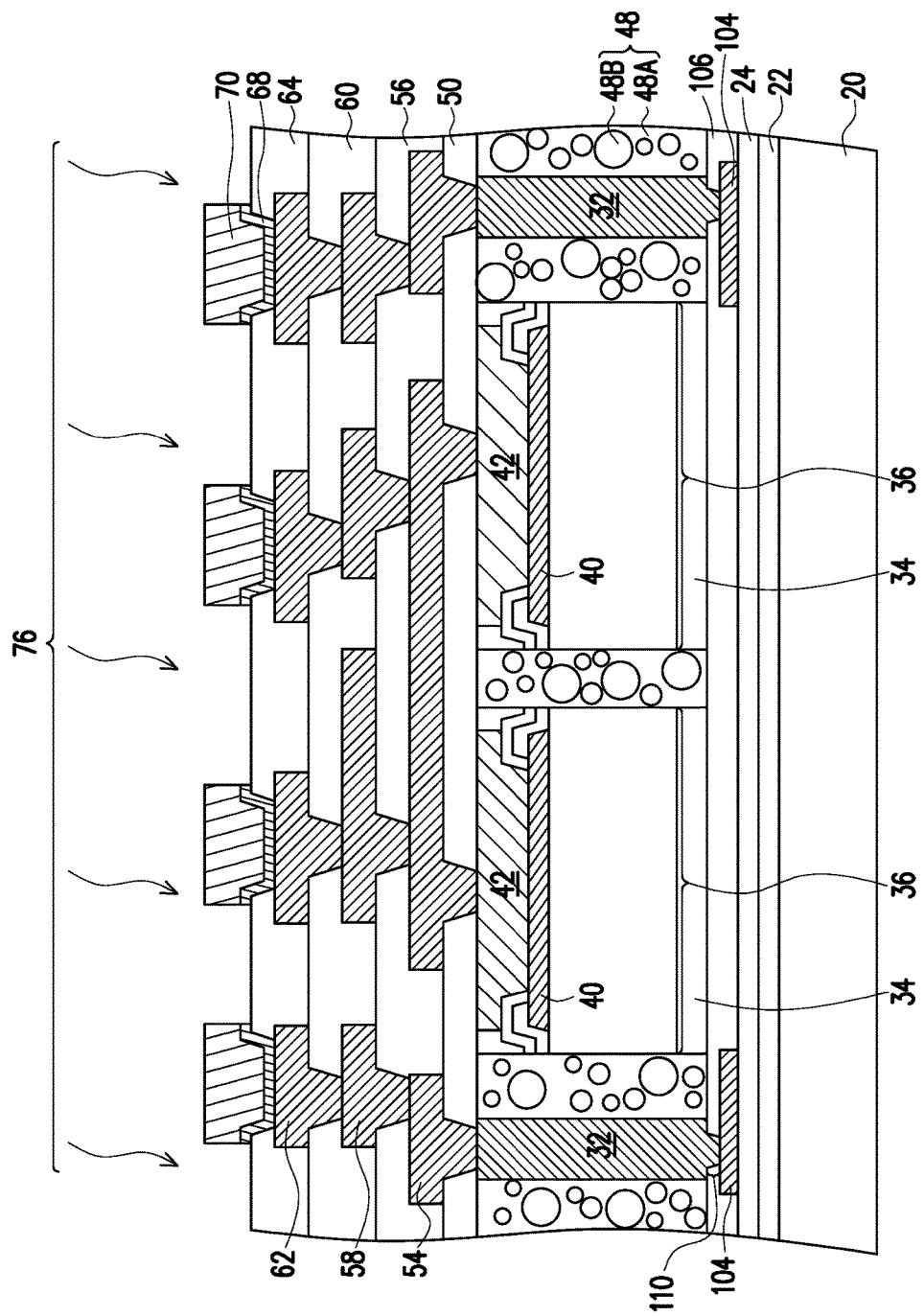
Figure 21:
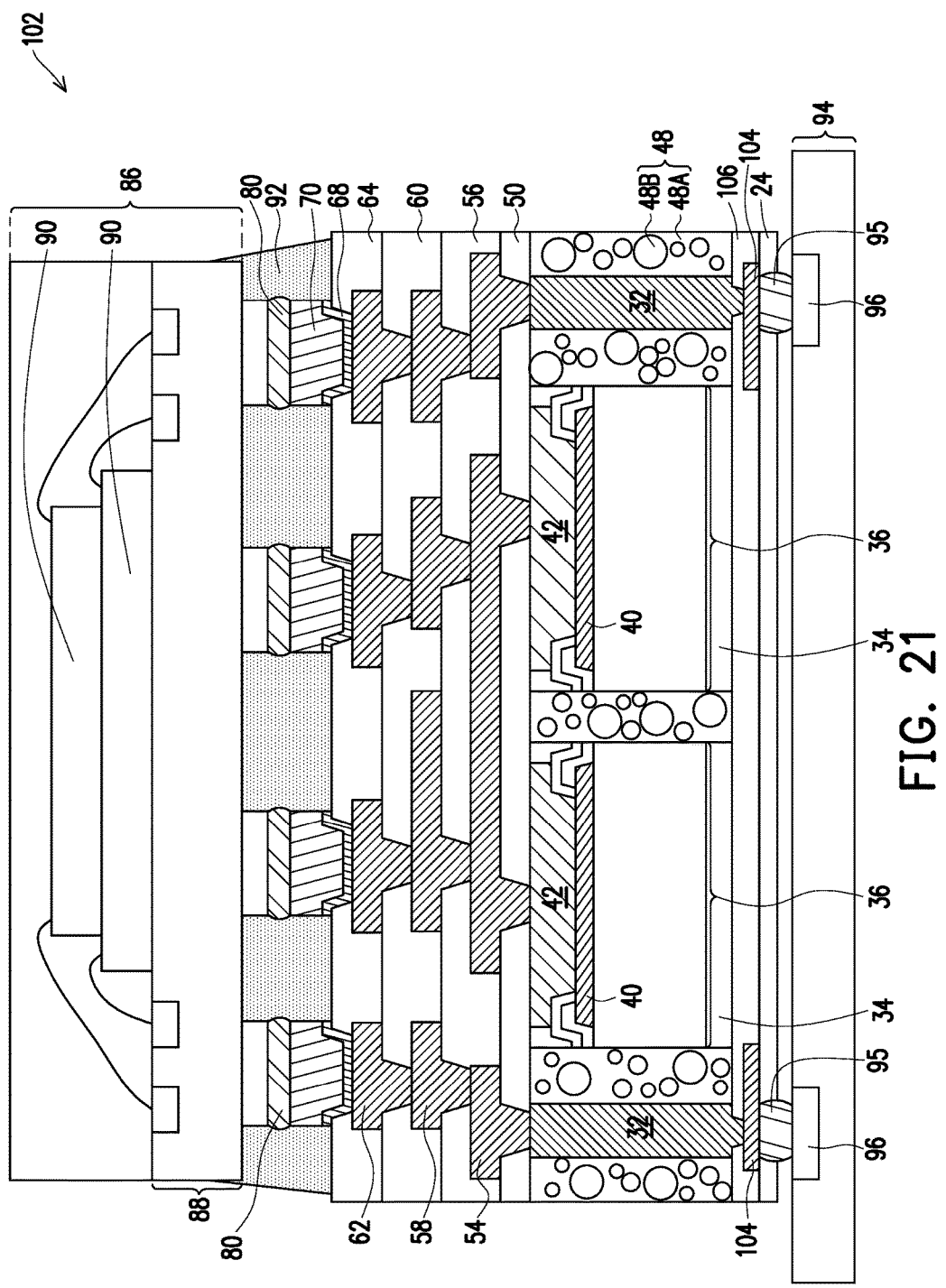

FIG. 20 illustrates the structure after the formation of the overlying structure including dielectric layers 50, 56, 60 and 64, RDLs 54, 58, and 62, UBMs 68, and electrical connectors 70. The plasma treatment and the etching processes 76 may also be performed. The details of the plasma treatment and the etching process may be found referring to the discussion of FIGS. 5 and 6, respectively. It is appreciated that the processes shown in FIGS. 15B-1 and 15B-2 may also apply. FIG. 21 illustrates the subsequent steps performed to form package 102.

Figure 22:
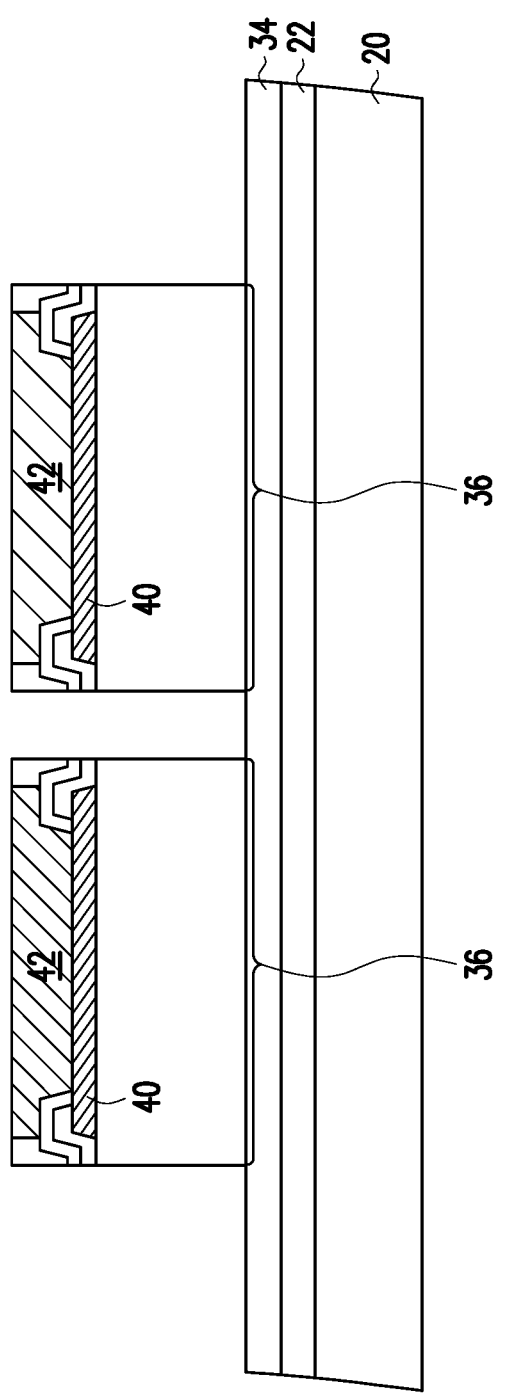
FIGS. 22 through 24 illustrate the cross-sectional views of intermediate stages in the formation of a package without through-vias in accordance with some embodiments.

FIGS. 22 through 25 illustrate the intermediate stages in the formation of a package in accordance with some embodiments of the present disclosure. These embodiments are similar to the embodiments shown in FIGS. 1 through 16, except that no through-vias are formed. Referring to FIG. 22, DAF 34 is formed, followed by attaching device dies 36 to DAF 34. DAF 34, instead of being discrete DAFs with each underlying the respective overlying device die 36, is a large DAF expanding over the entire carrier 20. In accordance with some embodiments of the present disclosure, the first treatment, the etching, and the second treatment as shown in FIGS. 5 through 7 are not performed in accordance with some embodiments.

Figure 23:
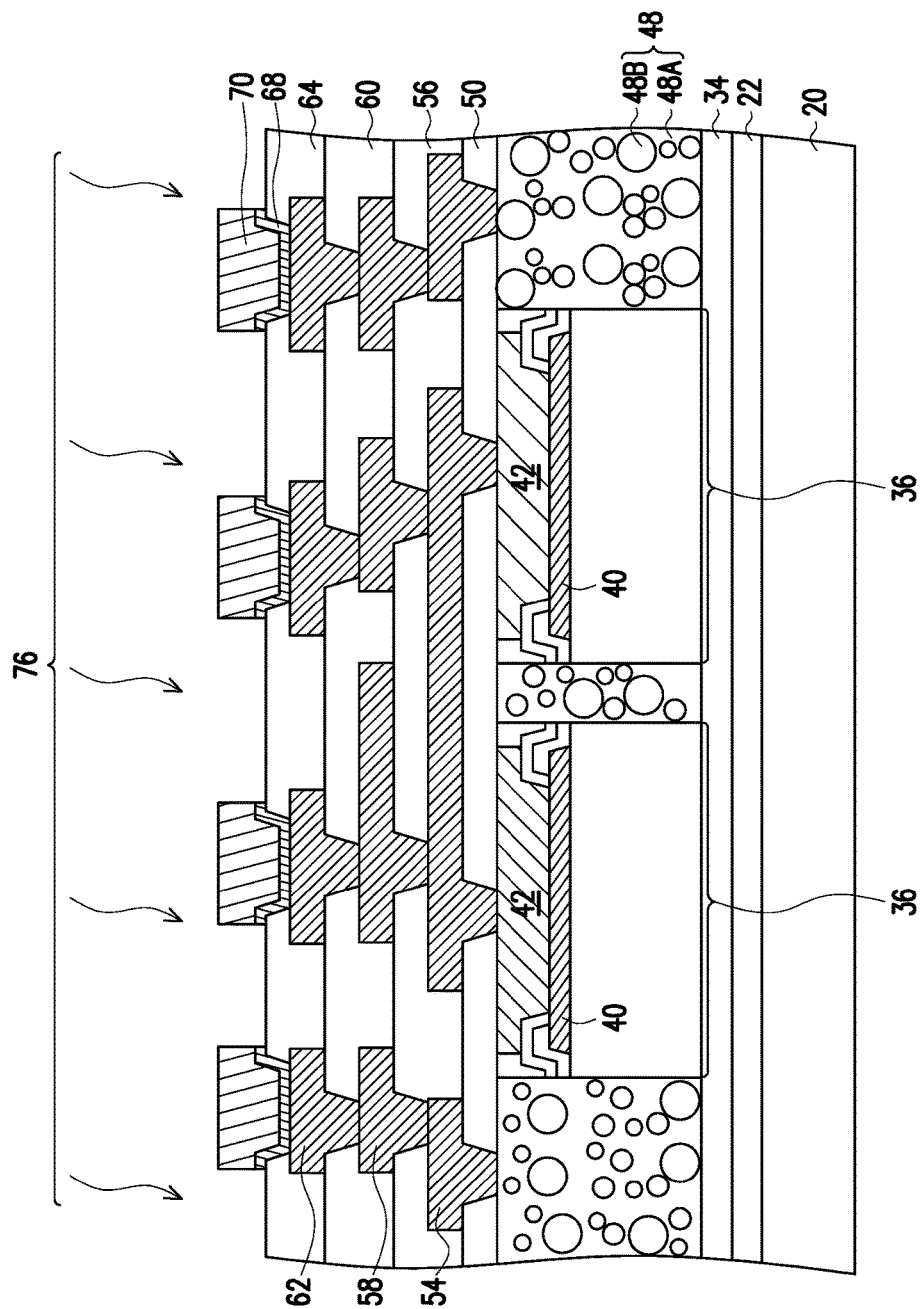
Figure 24:
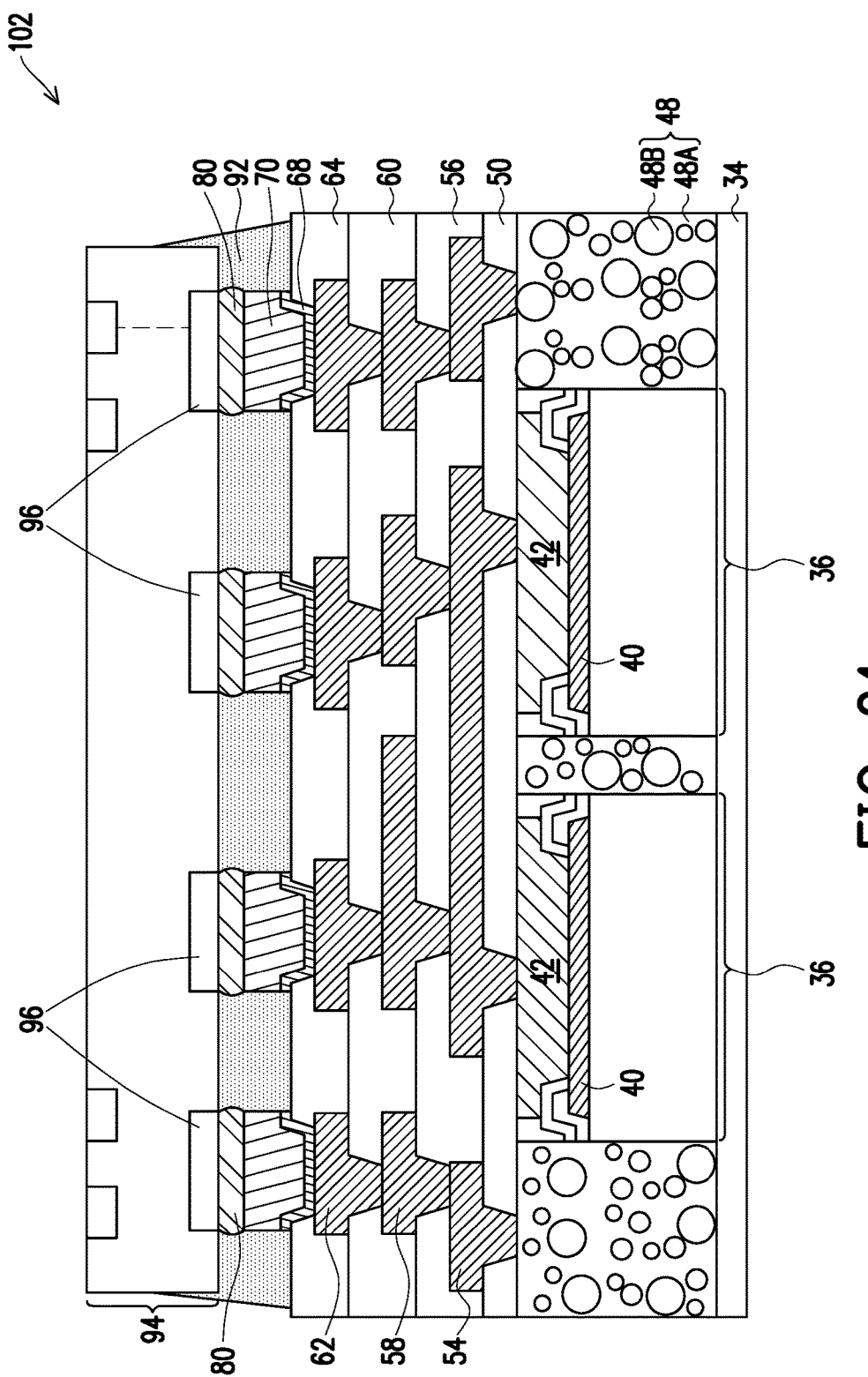

FIG. 23 illustrates the encapsulation of device dies 36 and the formation of the overlying dielectric layers 50, 56, 60 and 64, RDLs 54, 58, and 62, UBMs 68, and electrical connectors 70. In addition, processes 76 may be performed, which includes a plasma treatment and an etching process. The details of the plasma treatment and the etching process may be found referring to the discussion of FIGS. 5 and 6, respectively. It is appreciated that the processes shown in FIGS. 15B-1 and 15B-2 may also apply. FIG. 24 illustrates the subsequent steps performed to form package 102.

In above-illustrated exemplary embodiments, some exemplary processes and features are discussed in accordance with some embodiments of the present disclosure. Other features and processes may also be included. For example, testing structures may be included to aid in the verification testing of the three-dimensional (3D) packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. Experiments performed on wafers indicate that through the plasma treatment and the etching process, the metal residue left by the adhesion layer is significantly reduced. For example, first sample wafers are formed to have the metal posts on a dielectric buffer layer, similar to the structure shown in FIG. 5. Before the plasma treatment and the etching process, the metal particles (residue) occupy about 7.1% of the surface area of the dielectric buffer layer. After the plasma treatment and the etching process, the metal particles occupy less than 0.1 percent of the surface area of the dielectric buffer layer.

Second sample wafers are also formed to form the UBMs and the metal pillars on a dielectric layer, similar to the structure shown in FIG. 15A. Before the plasma treatment and the etching process, the metal particles (residue) occupy about 11.2% of the surface area of the dielectric buffer layer. After the plasma treatment and the etching process, the metal particles occupy about 0.3 percent of the surface area of the dielectric buffer layer. The significant reduction in the metal residue contributes to the reduction of the leakage current and the improved adhesion. In addition, the plasma treatment causes the increase in the surface roughness of the surface dielectric layer, and hence the adhesion is improved.

In accordance with some embodiments of the present disclosure, a method includes forming a metal seed layer on a first dielectric layer; forming a patterned mask over the metal seed layer, wherein an opening in the patterned mask is over a first portion of the first dielectric layer, and the patterned mask overlaps a second portion of the first dielectric layer; plating a metal region in the opening; removing the patterned mask to expose portions of the metal seed layer; etching the exposed portions of the metal seed layer; performing a first plasma treatment on a surface of the second portion of the first dielectric layer; and performing an etching process on the surface of the second portion of the first dielectric layer. In an embodiment, the method further comprises placing a device die on the second portion of the first dielectric layer; and encapsulating the metal region and the device die in an encapsulating material. In an embodiment, the method further comprises, after the etching process, performing a second plasma treatment on the metal region. In an embodiment, the second plasma treatment is performed using same process gases as the first plasma treatment. In an embodiment, the second plasma treatment is performed with a lower bias voltage than the first plasma treatment. In an embodiment, the etching process and the etching the exposed portions of the metal seed layer are performed using a same wet etching chemical. In an embodiment, the method further comprises joining a solder region with the metal region; and dispensing an underfill to encapsulate the solder region. In an embodiment, the first plasma treatment and the etching process are performed after joining the solder region. In an embodiment, the method further comprises forming a second dielectric layer; forming a redistribution line over the second dielectric layer; forming the first dielectric layer; forming an opening in the first dielectric layer; and forming a via in the first dielectric layer, wherein the via and the metal region are formed simultaneously.

In accordance with some embodiments of the present disclosure, a method includes forming a metal region over a dielectric layer; performing a first plasma treatment to bombard the dielectric layer, with a bias voltage applied during the first plasma treatment; performing a wet etching, with a surface of the dielectric layer exposed to a chemical used for the wet etching; and encapsulating the metal region in an encapsulating material, wherein the surface of the dielectric layer is in contact with the encapsulating material. In an embodiment, the method further comprises performing a second plasma treatment to oxidize a surface layer of the metal region. In an embodiment, both the first treatment and the second plasma treatment are performed using a process gas comprising oxygen ($O_2$). In an embodiment, the first plasma treatment is performed using a first process gas free from oxygen ($O_2$), and the second plasma treatment is performed using a process gas comprising oxygen ($O_2$). In an embodiment, the forming the metal region comprises: forming a metal seed layer having a bottom portion contacting the dielectric layer; and plating the metal region on the metal seed layer, wherein the wet etching is performed using the chemical that is configured to etch the bottom portion of the metal seed layer. In an embodiment, the metal seed layer further comprises a top portion, and the chemical is configured to not to etch the top portion of the metal seed layer.

In accordance with some embodiments of the present disclosure, a method includes forming a metal post protruding higher than a dielectric layer; bombarding a surface layer of the dielectric layer; performing an etching process to remove metal particles on the surface layer of the dielectric layer; and performing a plasma treatment on the metal post. In an embodiment, the method further comprises depositing a metal seed layer on the dielectric layer, wherein the metal post is formed on the metal seed layer; and etching the metal seed layer, wherein the metal particles are residue particles of the metal seed layer. In an embodiment, the metal seed layer comprises titanium, and the etching process is performed using a chemical solution configured to etch titanium. In an embodiment, the bombarding the surface layer of the dielectric layer is performed using a process gas comprising argon or nitrogen. In an embodiment, the process gas further comprises oxygen ($O_2$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a metal seed layer on a first dielectric layer;
forming a patterned mask over the metal seed layer, wherein an opening in the patterned mask is over a first portion of the first dielectric layer, and the patterned mask overlaps a second portion of the first dielectric layer;
plating a metal region in the opening;
removing the patterned mask to expose portions of the metal seed layer;
etching the exposed portions of the metal seed layer;
performing a first plasma treatment on a surface of the second portion of the first dielectric layer; and
performing an etching process on the surface of the second portion of the first dielectric layer.

2. The method of claim 1 further comprising:
placing a device die on the second portion of the first dielectric layer; and
encapsulating the metal region and the device die in an encapsulating material.

3. The method of claim 2 further comprising:
after the etching process, performing a second plasma treatment on the metal region.

4. The method of claim 3, wherein the second plasma treatment is performed using same process gases as the first plasma treatment.

5. The method of claim 3, wherein the second plasma treatment is performed with a lower bias voltage than the first plasma treatment.

6. The method of claim 1, wherein the etching process and the etching the exposed portions of the metal seed layer are performed using a same wet etching chemical.

7. The method of claim 1 further comprising:
joining a solder region with the metal region; and
dispensing an underfill to encapsulate the solder region.

8. The method of claim 7, wherein the first plasma treatment and the etching process are performed after joining the solder region.

9. The method of claim 1 further comprising:
forming a second dielectric layer;
forming a redistribution line over the second dielectric layer;
forming the first dielectric layer;
forming an opening in the first dielectric layer; and
forming a via in the first dielectric layer, wherein the via and the metal region are formed simultaneously.

10. A method comprising:
forming a metal region over a dielectric layer;
performing a first plasma treatment to bombard the dielectric layer, with a bias voltage applied during the first plasma treatment;
performing a wet etching, with a surface of the dielectric layer exposed to a chemical used for the wet etching; and
encapsulating the metal region in an encapsulating material, wherein the surface of the dielectric layer is in contact with the encapsulating material.

11. The method of claim 10 further comprising:
performing a second plasma treatment to oxidize a surface layer of the metal region.

12. The method of claim 11, wherein both the first treatment and the second plasma treatment are performed using a process gas comprising oxygen ($O_2$).

13. The method of claim 11, wherein the first plasma treatment is performed using a first process gas free from oxygen ($O_2$), and the second plasma treatment is performed using a process gas comprising oxygen ($O_2$).

14. The method of claim 10, wherein the forming the metal region comprises:
forming a metal seed layer having a bottom portion contacting the dielectric layer; and
plating the metal region on the metal seed layer, wherein the wet etching is performed using the chemical that is configured to etch the bottom portion of the metal seed layer.

15. The method of claim 14, wherein the metal seed layer further comprises a top portion, and the chemical is configured to not to etch the top portion of the metal seed layer.

16. A method comprising:
forming a metal post protruding higher than a dielectric layer;
bombarding a surface layer of the dielectric layer;
performing an etching process to remove metal particles on the surface layer of the dielectric layer; and
performing a plasma treatment on the metal post.

17. The method of claim 16 further comprising:
depositing a metal seed layer on the dielectric layer, wherein the metal post is formed on the metal seed layer; and
etching the metal seed layer, wherein the metal particles are residue particles of the metal seed layer.

18. The method of claim 17, wherein the metal seed layer comprises titanium, and the etching process is performed using a chemical solution configured to etch titanium.

19. The method of claim 16, wherein the bombarding the surface layer of the dielectric layer is performed using a process gas comprising argon or nitrogen.

20. The method of claim 19, wherein the process gas further comprises oxygen ($O_2$).

* * * * *